(12) United States Patent
Levander et al.

(10) Patent No.: US 10,204,855 B2
(45) Date of Patent: Feb. 12, 2019

(54) BENDABLE AND STRETCHABLE ELECTRONIC DEVICES AND METHODS

(71) Applicant: Intel Corporation, Santa Clara, CA (US)

(72) Inventors: Alejandro Levander, Santa Clara, CA (US); Tatyana Andryushchenko, Beaverton, OR (US); David Staines, Portland, OR (US); Mauro Kobrinsky, Portland, OR (US); Aleksandar Aleksov, Chandler, AZ (US); Dilan Seneviratne, Phoenix, AZ (US); Javier Soto Gonzalez, Chandler, AZ (US); Srinivas Pietambaram, Gilbert, AZ (US); Rafiqul Islam, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/653,033

(22) PCT Filed: Jul. 11, 2014

(86) PCT No.: PCT/US2014/046395
§ 371 (c)(1),
(2) Date: Jun. 17, 2015

(87) PCT Pub. No.: WO2016/007175
PCT Pub. Date: Jan. 14, 2016

(65) Prior Publication Data
US 2016/0284630 A1    Sep. 29, 2016

(51) Int. Cl.
*H01L 23/00* (2006.01)
*H01L 23/498* (2006.01)
(Continued)

(52) U.S. Cl.
CPC .......... *H01L 23/4985* (2013.01); *B23B 5/16* (2013.01); *B32B 27/08* (2013.01); *B32B 27/283* (2013.01);
(Continued)

(58) Field of Classification Search
CPC ....... H01L 2924/00014; H01L 23/4985; H01L 23/49866; H01L 23/49894;
(Continued)

(56) References Cited

U.S. PATENT DOCUMENTS

| 5,976,912 A | 11/1999 | Fukutomi et al. |
| 8,217,381 B2 | 7/2012 | Rogers et al. |

(Continued)

FOREIGN PATENT DOCUMENTS

| CN | 1144016 A | 2/1997 |
| CN | 1674241 A | 9/2005 |

(Continued)

OTHER PUBLICATIONS

"International Application Serial No. PCT/US2014/046395, International Search Report dated Apr. 20, 2015", 5 pgs.
(Continued)

*Primary Examiner* — Mounir Amer
*Assistant Examiner* — Alexander Belousov
(74) *Attorney, Agent, or Firm* — Schwegman Lundberg & Woessner, P.A.

(57) ABSTRACT

Generally discussed herein are systems and methods that can include a stretchable and bendable device. According to an example a method can include (1) depositing a first elastomer material on a panel, (2) laminating trace material on the elastomer material, (3) processing the trace material to pattern the trace material into one or more traces and one or more bond pads, (4) attaching a die to the one or more bond pads, or (5) depositing a second elastomer material on and
(Continued)

around the one or more traces, the bonds pads, and the die to encapsulate the one or more traces and the one or more bond pads in the first and second elastomer materials.

5 Claims, 15 Drawing Sheets

(51) Int. Cl.
| | |
|---|---|
| *B23B 5/16* | (2006.01) |
| *B32B 27/08* | (2006.01) |
| *B32B 27/28* | (2006.01) |
| *H01L 21/48* | (2006.01) |
| *H01L 21/56* | (2006.01) |
| *H01L 21/683* | (2006.01) |
| *H01L 21/78* | (2006.01) |
| *H01L 23/31* | (2006.01) |
| *H01L 25/00* | (2006.01) |
| *H05K 1/02* | (2006.01) |

(52) U.S. Cl.
CPC ........ *H01L 21/4846* (2013.01); *H01L 21/561* (2013.01); *H01L 21/565* (2013.01); *H01L 21/568* (2013.01); *H01L 21/6835* (2013.01); *H01L 21/78* (2013.01); *H01L 23/3135* (2013.01); *H01L 23/49811* (2013.01); *H01L 23/49838* (2013.01); *H01L 23/49866* (2013.01); *H01L 23/49894* (2013.01); *H01L 24/85* (2013.01); *H01L 24/96* (2013.01); *H01L 25/50* (2013.01); *B32B 2307/54* (2013.01); *B32B 2307/7265* (2013.01); *B32B 2439/00* (2013.01); *B32B 2457/00* (2013.01); *H01L 24/48* (2013.01); *H01L 2221/68345* (2013.01); *H01L 2221/68381* (2013.01); *H01L 2224/48227* (2013.01); *H01L 2224/81192* (2013.01); *H01L 2224/81203* (2013.01); *H01L 2224/81815* (2013.01); *H01L 2224/85801* (2013.01); *H01L 2924/00014* (2013.01); *H01L 2924/01013* (2013.01); *H01L 2924/01022* (2013.01); *H01L 2924/01024* (2013.01); *H01L 2924/01029* (2013.01); *H01L 2924/01079* (2013.01); *H01L 2924/0715* (2013.01); *H01L 2924/15747* (2013.01); *H01L 2924/15791* (2013.01); *H05K 1/0283* (2013.01)

(58) Field of Classification Search
CPC ......... H01L 23/49838; H01L 23/49811; H01L 23/3135; H01L 21/78; H01L 21/6835; H01L 21/568; H01L 21/565; H01L 21/561; H01L 2924/15747; H01L 21/4846; H01L 2924/15791; H01L 2924/0715; H01L 2924/01079; H01L 2924/01029; H01L 2924/01024; H01L 2924/01022; H01L 2924/01013; H01L 2924/207; H01L 2307/7265; H01L 2439/00; H01L 2457/00; H05K 1/00; B32B 27/283; B32B 2307/54; B32B 27/08; B32B 2307/7265; B32B 2439/00; B32B 2457/00; B32B 5/16
See application file for complete search history.

(56) References Cited

U.S. PATENT DOCUMENTS

| 8,524,311 | B1 | 9/2013 | Greenberg et al. |
| 2005/0206016 | A1 | 9/2005 | Shohji et al. |
| 2006/0231288 | A1 | 10/2006 | Vanfleteren et al. |
| 2007/0040251 | A1 | 2/2007 | Seah et al. |
| 2007/0123963 | A1 | 5/2007 | Krulevitch |
| 2008/0157235 | A1* | 7/2008 | Rogers ................ H01L 21/8258 257/415 |
| 2008/0188020 | A1 | 8/2008 | Wei-min et al. |
| 2009/0004784 | A1 | 1/2009 | Huang et al. |
| 2010/0087782 | A1 | 4/2010 | Ghaffari et al. |
| 2011/0169150 | A1 | 7/2011 | Su et al. |
| 2012/0051005 | A1 | 3/2012 | Vanfleteren et al. |
| 2012/0112347 | A1 | 5/2012 | Eckhardt et al. |
| 2012/0176764 | A1 | 7/2012 | Loher et al. |
| 2012/0226130 | A1 | 9/2012 | De Graff et al. |
| 2013/0252383 | A1 | 9/2013 | Chen |

FOREIGN PATENT DOCUMENTS

| CN | 101681695 A | 3/2010 |
| CN | 102044520 A | 5/2011 |
| CN | 103325696 A | 9/2013 |
| CN | 105431292 A | 3/2016 |
| DE | 102009031568 A1 | 12/2010 |
| EP | 0751561 A1 | 1/1997 |
| EP | 1746869 A1 | 1/2007 |
| JP | 2005216989 A | 8/2005 |
| JP | 2005311321 A | 11/2005 |
| JP | 2008211187 A | 9/2008 |
| JP | 2016527730 A | 9/2016 |
| KR | 1020040028799 A | 4/2004 |
| KR | 1020060044486 A | 5/2006 |
| KR | 1020160021071 A | 2/2016 |
| TW | 200414454 A | 8/2004 |
| TW | 200507224 A | 2/2005 |
| TW | 200921873 A | 5/2009 |
| TW | 201322405 A | 6/2013 |
| TW | 201340221 A | 10/2013 |
| TW | 201606880 A | 2/2016 |
| TW | I614815 B | 2/2018 |
| WO | WO-9526047 A1 | 9/1995 |
| WO | WO-2005122285 A2 | 12/2005 |
| WO | WO-2010086416 A1 | 8/2010 |
| WO | WO-2011000580 A1 | 1/2011 |
| WO | WO-2013144738 A2 | 10/2013 |
| WO | WO-2016007175 A1 | 1/2016 |

OTHER PUBLICATIONS

"International Application U.S. Appl. No. PCT/US2014/046395, Written Opinion dated Apr. 30, 2015", 10 pgs.
"Taiwanese Application Serial No. 104119777, Office Action dated Apr. 6, 2016", w/ English Claims, 9 pgs.
"Chinese Application Serial No. 201480003748.5, Office Action dated Apr. 24, 2017", w/o English Translation, 7 pgs.
"Chinese Application Serial No. 201480003748.5, Office Action dated Sep. 2, 2016", Without English Translation, 7 pgs.
"Chinese Application Serial No. 201480003748.5, Response filed Jan. 12, 2017 to Office Action dated Sep. 2, 2016", (English Translation of Claims), 11 pgs.
"International Application Serial No. PCT/US2014/046395, International Preliminary Report on Patentability dated Jan. 26, 2017", 12 pgs.
"Japanese Application Serial No. 2016-533302, Office Action dated Apr. 4, 2017", w/ English Claims, 11 pgs.
"Japanese Application Serial No. 2016-533302, Office Action dated Aug. 30, 2016", W/ English Translation, 8 pgs.
"Japanese Application Serial No. 2016-533302, Response filed Nov. 11, 2016 to Office Action dated Aug. 30. 2016", W/ English Claims and Partial English Translation, 26 pgs.
"Korean Application No. 10-2015-7017041, Office Action dated Apr. 22, 2016", w/ English Claims, 13 pgs.
"Korean Application No. 10-2015-7017041, Response filed Jun. 22, 2016 to Office Action dated Apr. 22, 2016", W/ English Translation of Claims, 36 pgs.
"Taiwanese Application Serial No. 104119777, Office Action dated Sep. 9, 2016", w/ English Claims, 7 pgs.
"Chinese Application Serial No. 201480003748.5, Office Action dated Sep. 14, 2017", w/English Translation, 13 pgs.

(56) References Cited

OTHER PUBLICATIONS

"Chinese Application Serial No. 201480003748.5, Response filed Jul. 4, 2017 to Office Action dated Apr. 24, 2017", w/ English Claims, 7 pgs.

"Taiwanese Application Serial No. 104119777, Response filed May 9, 2017 to Office Action dated Sep. 9, 2016", w/ English Translation, 72 pgs.

"Chinese Application Serial No. 201480003748.5, Response filed Jan. 16, 2018 to Examiner Interview Summary dated Jan. 16, 2018", w/ English Claims, 4 pgs.

"Chinese Application Serial No. 201480003748.5, Response filed Nov. 27, 2017 to Office Action dated Sep. 14, 2017", w/ English Claims, 8 pgs.

"European Application Serial No. 14873107.8, Extended European Search Report dated Mar. 15, 2018", 7 pgs.

"European Application Serial No. 14873107.8, Response filed Oct. 11, 2018 to Extended European Search Report dated Mar. 15, 2018", 13 pgs.

\* cited by examiner

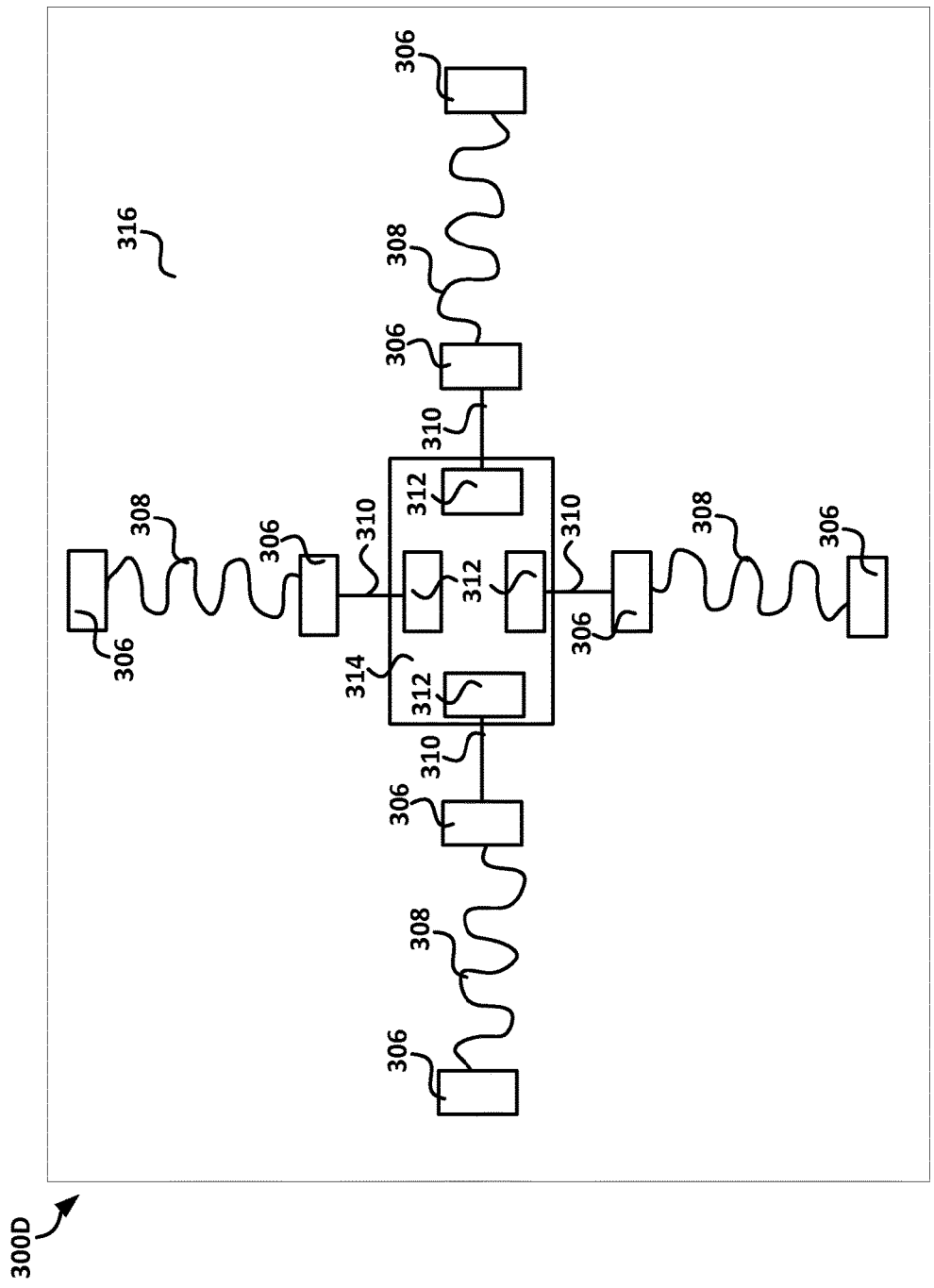
FIG. A

BENDABLE AND STRETCHABLE ELECTRONIC DEVICES AND METHODS

CLAIM OF PRIORITY

This application is a U.S. National Stage Application under 35 U.S.C. 371 from International Application No. PCT/US2014/046395, filed Jul. 11, 2014, which is hereby incorporated by reference in its entirety.

TECHNICAL FIELD

Examples generally relate to bendable and stretchable electronic devices and methods.

TECHNICAL BACKGROUND

Electronic device packages are typically rigid. An electronic device can be integrated into a variety of package form factors by making the package more flexible. By making a package more flexible, the package can conform to a variety of contours so as to be comfortably integrated into more applications.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates a planar view block diagram of the device of FIG. 3D in the direction of arrows labeled "4", according to one or more embodiments.

DESCRIPTION OF EMBODIMENTS

Figure 1A:
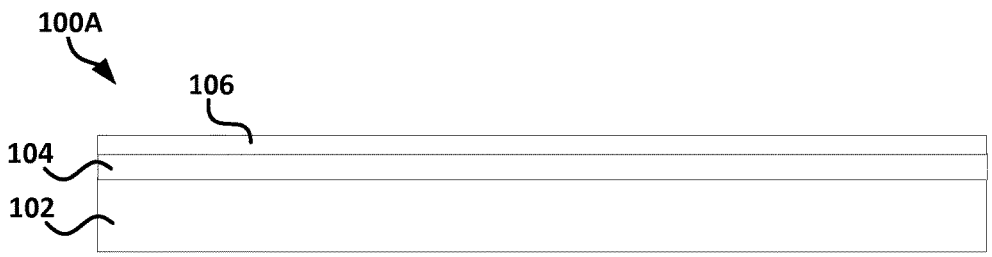
FIGS. 1A, 1B, 1C, 1D, 1E, 1F, 1G, 1H, 1I, 1J, 1K, and 1L illustrate block diagrams of a process for forming a conductive interconnect, according to one or more embodiments.

Examples in this disclosure relate generally to stretchable and bendable electronic devices and methods.

New, wearable computing applications can be enabled by flexible (e.g., bendable and stretchable) electronics packages, such as can be built around a bendable die. However, current solutions include bendable packages or stretchable metal interconnects separately and not together.

This disclosure considers, among other things, a bendable, and thin (e.g., three hundred microns or thinner) die embedded in one or more elastomer materials. The die can be connected to a stretchable interconnect. Packages (e.g., devices), as discussed herein, can include a stretchable and bendable electronics package with a die or other component. A device discussed herein can provide a wearable electronic system. The device can be attached to clothing or directly to skin or other curved surface, such as to conform to a contour of the surface. The die can be generally unbendable. Such a die can be sized so its rigidity does not substantially influence the overall flexibility of the system in which it is embedded.

As used herein the term "component" generally refers to a die or other electrical or electronic item, such as a resistor, transistor, inductor, capacitor, digital logic, light emitting element, etc. A die can be less three hundred micrometers (e.g., less than one hundred micrometers thick), so as to be bendable. Additionally or alternatively, the die can be sized or shaped so that it only insignificantly impacts the flexibility of the system in which it is embedded. Passive types of non-die components (resistor, inductor, capacitor, etc.) are generally one hundred fifty micrometers thick or thicker, with standard thicknesses of about two hundred fifty, three hundred, or five hundred micrometers thick or thicker. Sensor components are typically between about two hundred micrometers and about one and a half millimeters thick. LEDs or Laser Diodes (LD) are typically about the same thickness as sensor components. Connector components, and the like are typically at least six hundred micrometers thick with ultra-flat connectors typically about nine hundred micrometers to about one and a half millimeters thick.

A device, as discussed herein, can improve upon a known solution to a bendable or stretchable system that uses a Polylmide (PI) as an encapsulating material, but which is only bendable and not stretchable or is stretchable and not bendable. As used herein, bendable means rotation and stretchable means elongation. A device as discussed herein can provide an improvement on an existing device that only involve metal lines with simple sensors designed into them (e.g., a resistance temperature sensor) embedded in Poly-DiMethylSiloxane (PDMS) to attain a flexible device, since devices discussed herein can provide more functionality than just a temperature sensing capability, such as by including a die (e.g., a bendable die). Also, processes as discussed herein are scalable so as to provide for manufacturability of the devices.

An advantage of one or more devices discussed herein can include protecting a component from an environmental influence (e.g., corrosion, moisture, oxygen, weathering, impact or other force, among others), such as by encapsulating the component in a flexible material that is moisture resistant or absorbs some force of an impact thereon. These advantages can be attained while still providing for a biocompatible device.

Discussed herein are processes of making a device at a wafer-level and at a panel level. One or more wafer-level processes for constructing a device with thicker traces (e.g., about five hundred nanometers to about ten microns or thicker) and one or more wafer-level processes for constructing a device with thinner traces (e.g., about one hundred nanometers to about five hundred nanometers) are discussed herein. FIGS. 1A-1L detail operations of one or more processes for making a device with thicker traces and FIGS. 2A-2P detail operations of one or more processes for making a device with thinner traces. The thicker traces can provide lower resistance than the thinner traces. The thinner traces can have a higher resistance than the thicker traces. Mechanical support can be provided to the thinner traces by situating the traces on or in an encapsulant. The encapsulant can include a rigidity (e.g., an elastic modulus) that is between the rigidity of the trace and a flexible substrate (e.g., an elastomer) of the device.

Also discussed herein is a release method to allow the package structure to detach from a substrate carrier (e.g., a wafer) after a die or component attach or a first elastomer encapsulation.

The panel-level process flows can include no, partial or full encapsulation of individual traces by a material, such as a material with an elastic modulus between the elastomer and the trace material. After die or other component mount or attach and after a first elastomer encapsulation, the package layers can be released from the carrier panel by release methods discussed herein.

Both the panel and wafer level processes can include at least two different methods for attaching a die or other component, including, for example, wire bonding or solder attach.

For simplicity, it will be assumed that the trace material includes copper, although other metals or conductive materials capable of providing electrical connections can be used. Copper is an inherently "stiff" material (i.e. the elastic range of copper is typically less than 0.5% strain or elongation). To allow traces made of such a stiff material to be stretchable or bendable, the traces can be "meandering", such as to generally replicate a 2D spring to achieve a stretching or bending ability. It will be understood that other trace material may be used and similar designs or even straight traces may be used depending on the properties of the trace material.

Also, where PolyDiMethylSiloxane (PDMS) is indicated as the elastomer it will be understood that other elastomer materials such as Viton®, butyl rubber, or polyurethane can be used. PDMS is a good prototyping material and is discussed herein as a possible elastomer material.

The discussion begins with a discussion of wafer-level processes followed by panel-level processes. Reference will now be made to the FIGS. to describe more details of apparatuses, systems, or processes in accord with one or more embodiments.

FIGS. 1A, 1B, 1C, 1D, 1E, 1F, 1G, 1H, II, 1J, 1K, and 1L depict a process for forming a thick conductive interconnect, according to one or more embodiments.

FIG. 1A illustrates a block diagram of a device 100A that includes a substrate 102, an oxide layer 104 on the substrate, and a layer of evaporated material 106 (e.g., copper) on the oxide layer 104, according to one or more embodiments. The evaporated material 106 can provide a release layer for releasing the substrate 102 and the oxide layer 104. The evaporated material 106 can be deposited on the oxide layer 104. In one or more embodiments, the substrate 102 can include silicon and the oxide layer 104 can include a thermal silicon oxide.

Figure 1B:
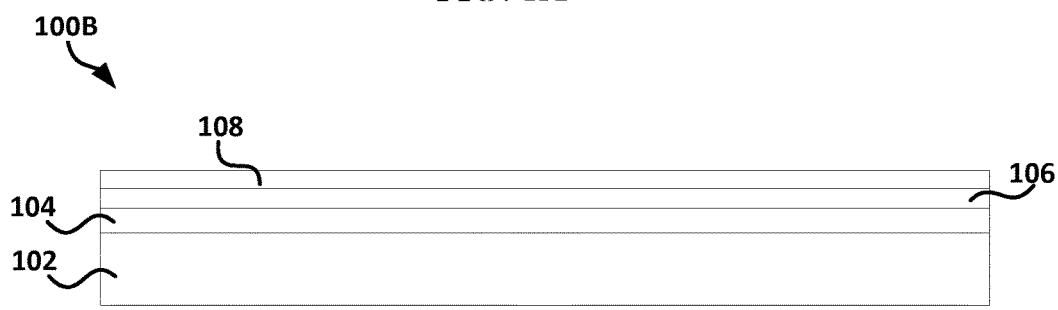

FIG. 1B illustrates a device 100B that includes the device 100A with a conductive material 108 on the evaporated material 106, according to one or more embodiments. The conductive material 108 can include copper or other metal. The conductive material 108 can provide a seed for electroplating thereon. The conductive material 108 can include a metal with relatively high density.

Figure 1C:
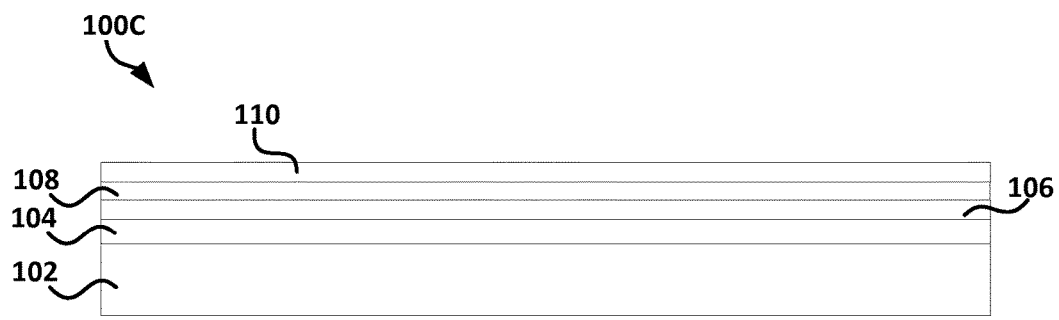

FIG. 1C illustrates a device 100C that includes the device 100B with a metal layer 110 on the conductive material 108, according to one or more embodiments. The metal layer 110 can be electroplated on the conductive material 108. The metal layer 110 can provide mechanical stability for items situated thereon or there over, such as during a release process.

Figure 1D:
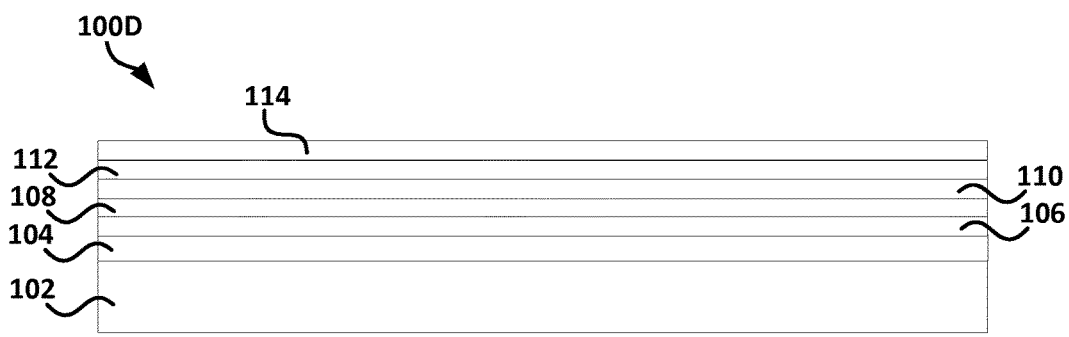
Figure 1E:
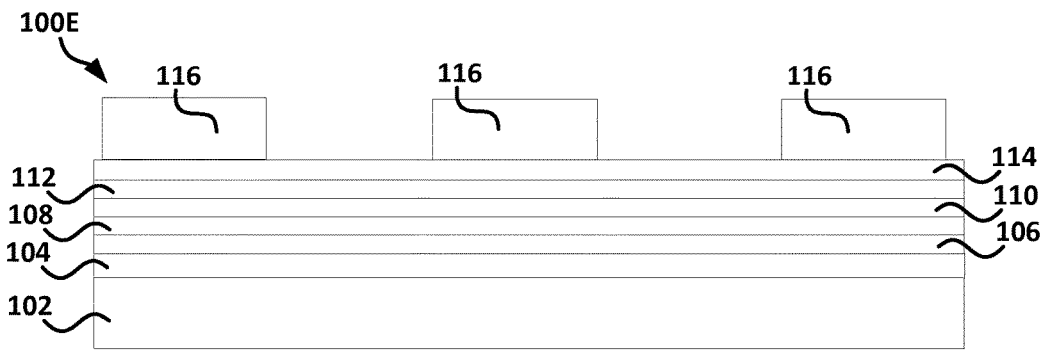

FIG. 1D illustrates a device 100D that includes the device 100C with an etch stop layer 112 and an adhesion layer 114 thereon, according to one or more embodiments. The adhesion layer 114 can be sputtered. The adhesion layer 114 can include a metal, such as copper, titanium, or chromium. The adhesion layer 114 can provide a medium conducive to bonding a conductive material thereto. FIG. 1E illustrates a device 100E that includes the device 100D with patterning material 116 (e.g., photo resist) situated thereon, according to one or more embodiments. The patterning material 116 can help define the shape and extent of electrical interconnects of the device. The patterning material 116 can be patterned to provide meandering interconnects that can stretch or bend. The patterning material 116 can be thicker than interconnects to be formed there between.

Figure 1F:
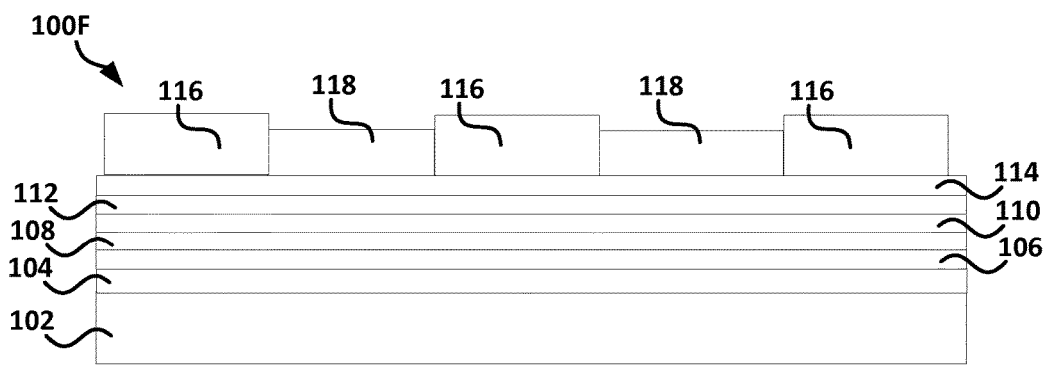
Figure 1G:
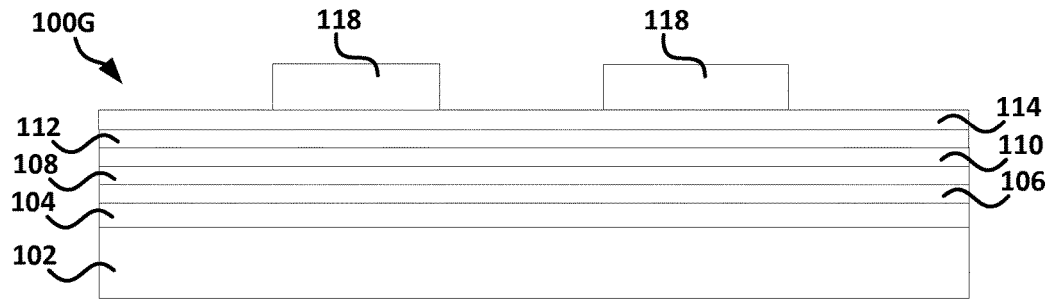

FIG. 1F illustrates a device 100F that includes the device 100E with a conductive material 118 situated in a gap in the patterning material 116, according to one or more embodiments. The conductive material 118 can be relatively thick (e.g., greater than five hundred nanometers thick). FIG. 1G illustrates a device 100G that includes the device 100F with the patterning material 116 removed there from, according to one or more embodiments. The patterning material 116 can be removed using ash or a solvent.

Figure 1H:
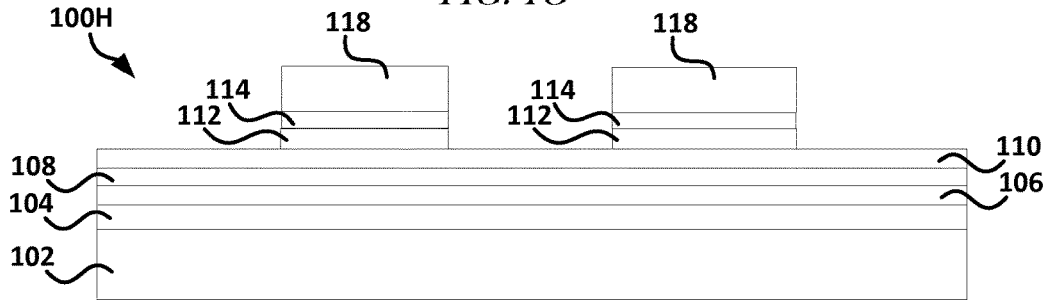
Figure 1I:
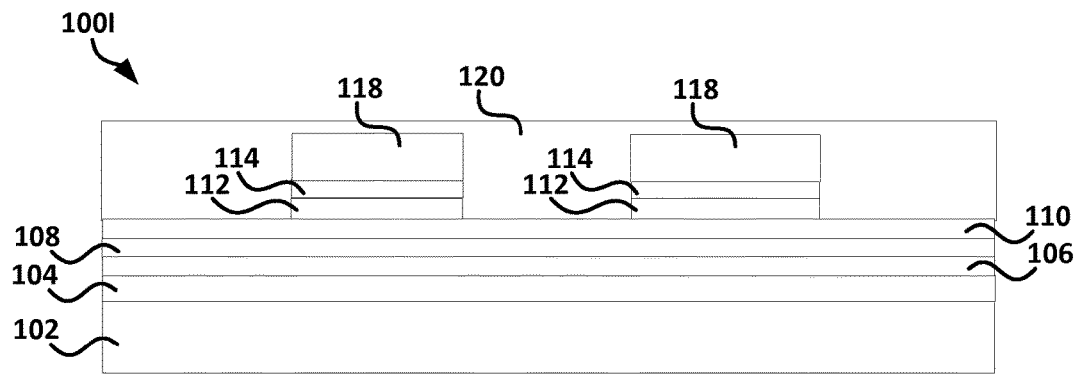

FIG. 1H illustrates a device 100H that includes the device 100G with the adhesion layer 114 and a portion of the etch stop layer 112 removed there from, according to one or more embodiments. The adhesion layer 114 can be removed, such as by wet or dry etching. FIG. 1I illustrates a device 100I that includes the device 100H with an elastomer material 120 situated thereon, according to one or more embodiments. The elastomer material 120 can cover or help encapsulate the conductive material 118. The elastomer material 120 can provide protection from an environment external to the elastomer material 120. The elastomer material 120 can be bendable and stretchable. The elastomer material 120 can be cured, such as to give the elastomer material a more definite shape. The elastomer material 120 can include particles with an elastic modulus less than that of the elastomer material 120 embedded therein. Such particles can affect how strain is distributed in the device. In one or more examples, the particles can include silica or other material with an elastic modulus less than the elastic modulus of the elastomer material 120.

Figure 1J:
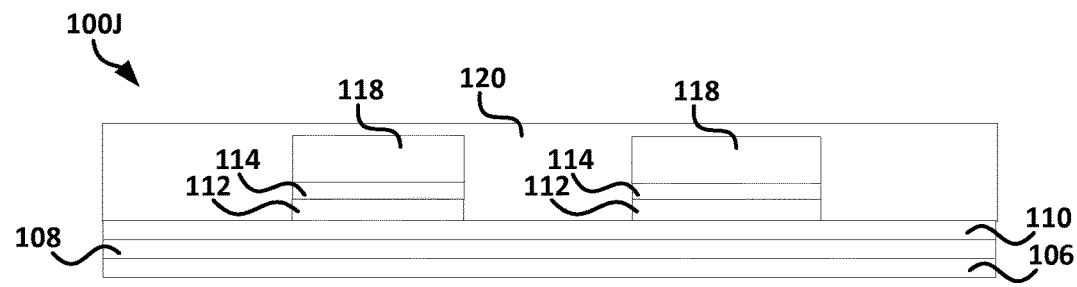
Figure 1K:
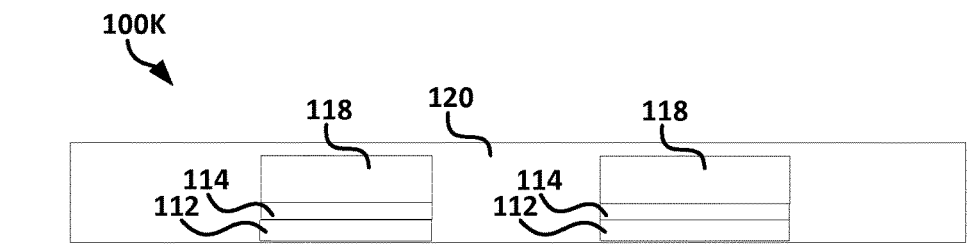

FIG. 1J illustrates a device 100J that includes the device 100I with the substrate 102 and the oxide layer 104 removed there from, according to one or more embodiments. The substrate 102 and oxide layer 104 can be removed, such as by exposing the oxide layer 104 to water, such as by bathing the device 100I in water. FIG. 1K illustrates a device 100K that includes the device 100J with the evaporated material 106, conductive material 108, and metal layer 110 removed there from, according to one or more embodiments. The evaporated material 106, conductive material 108, and the metal layer 110 can be removed, such as by dry or wet etching them from the device 100J.

Figure 1L:
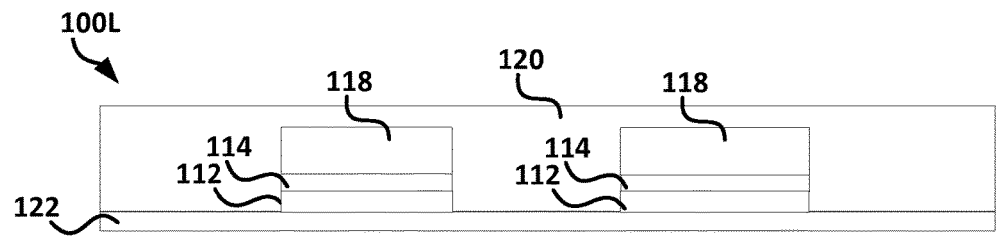

FIG. 1L illustrates a device 100L that includes the device 100K with an elastomer material 122 situated thereon, according to one or more embodiments. The elastomer material 122 can include the same or a different material as the elastomer material 120. The elastomer material 122 and the elastomer material 120 can fully or partially encapsulate the conductive interconnects (e.g., the conductors including the adhesion layer 114 and the conductive material 118) or any dies or components electrically coupled to the conductive interconnects.

FIGS. 2A, 2B, 2C, 2D, 2E, 2F, 2G, 2H, 2I, 2J, 2K, 2L, 2M, 2N, 2O, and 2P depict a process for forming a thin conductive interconnect, according to one or more embodiments.

Figure 2A:
FIGS. 2A, 2B, 2C, 2D, 2E, 2F, 2G, 2H, 2I, 2J, 2K, 2L, 2M, 2N, 2O, and 2P illustrate block diagrams of another process for forming a conductive interconnect, according to one or more embodiments.
Figure 2B:
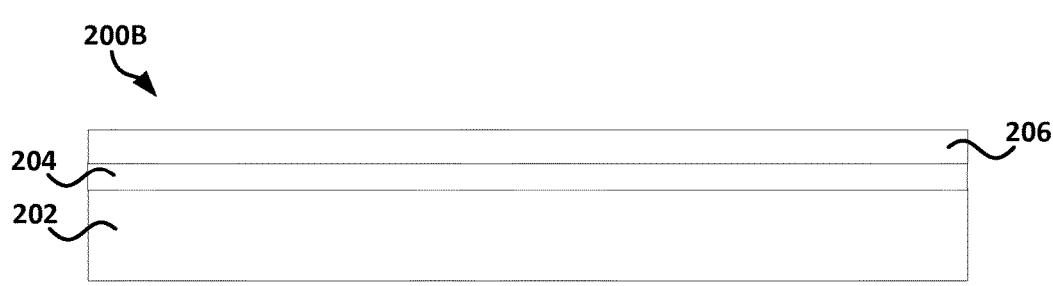

FIG. 2A illustrates a block diagram of a device 200A that includes a substrate 202, and a release layer 204 situated on the substrate 202, according to one or more embodiments. FIG. 2B illustrates a block diagram of a device 200B that includes the device 200A with a Polylmide (PI) 206 on the release layer 204, according to one or more embodiments. The PI 206 can be spun on. The PI 206 can be cured.

Figure 2C:
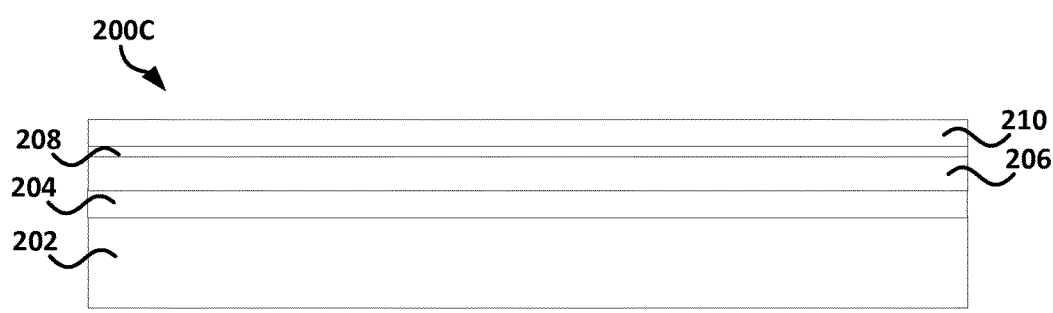
Figure 2D:

FIG. 2C illustrates a block diagram of a device 200C that includes the device 200B with an adhesion layer 208 and a seed layer 210 situated thereon, according to one or more embodiments. The seed layer 210 can include a metal that adheres to the adhesion layer 208. The adhesion layer 208 can include a metal, such as copper, titanium, or chromium. FIG. 2D illustrates a block diagram of a device 200D that includes the device 200C with a conductive material 212 deposited on the seed layer 210, according to one or more embodiments. The conductive material 212 can include a metal, such as copper, aluminum, or gold, among others, or other conductive material.

Figure 2E:
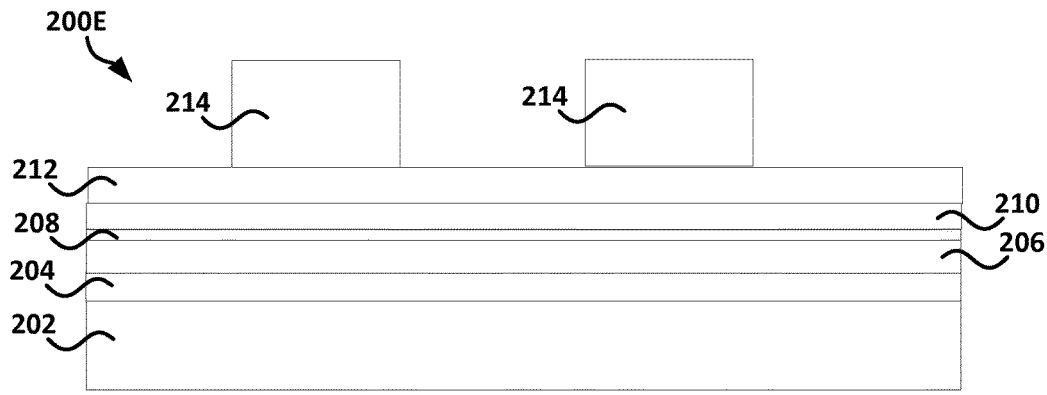
Figure 2F:
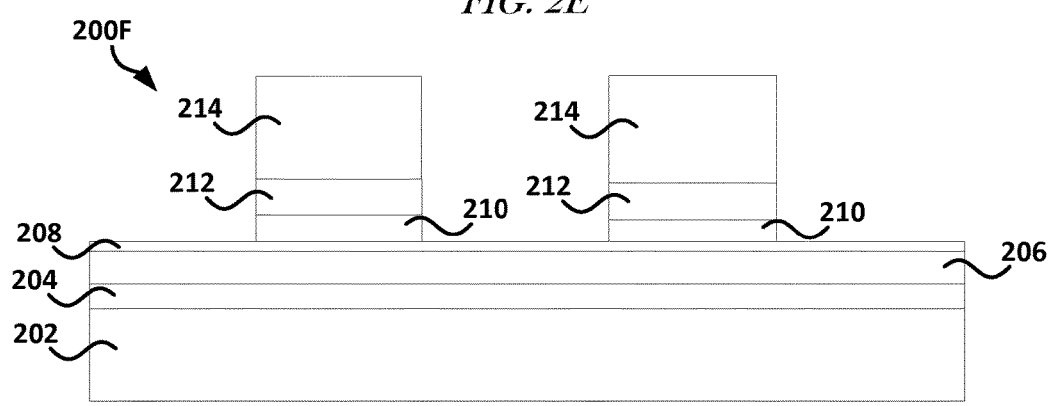

FIG. 2E illustrates a block diagram of a device 200E that includes the device 200D with a photo resist 214 patterned on the conductive material 212, according to one or more embodiments. The photo resist 214 can define where the conductive material 212 will remain after an etching process is performed. The photo resist 214 can be patterned so as to create a meandering trace after an etch of the conductive material 212 is performed. FIG. 2F illustrates a block diagram of a device 200F that includes the device 200E after a dry or wet etch has been performed, according to one or more embodiments. The wet or dry etch can remove portions of the seed layer 210 or the conductive material 212 that are not covered by the photo resist 214.

Figure 2G:
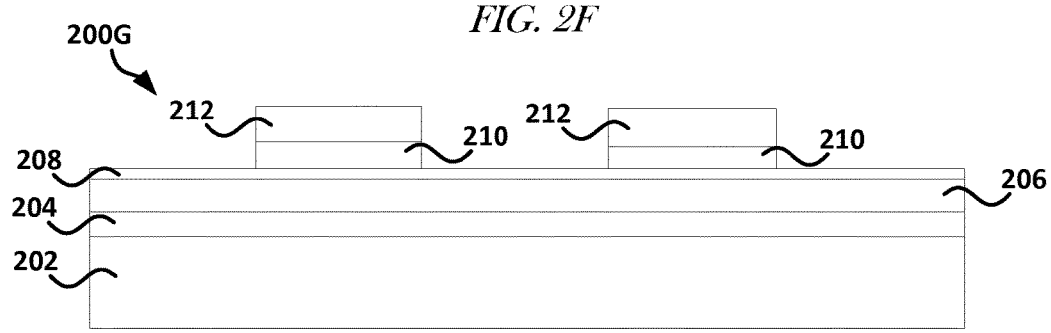
Figure 2H:
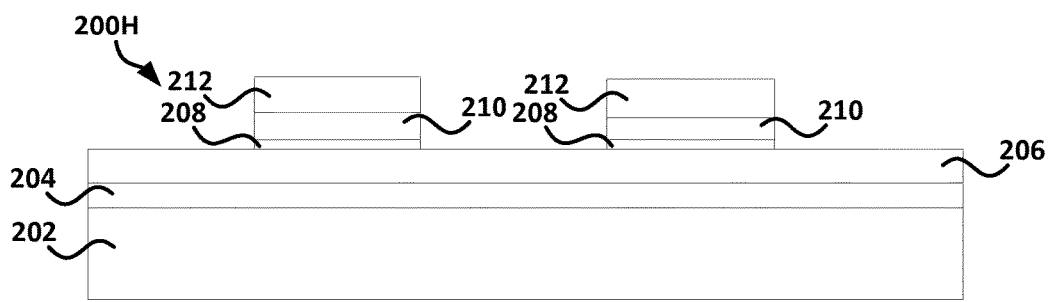

FIG. 2G illustrates a block diagram of a device 200G that includes the device 200F with the photo resist 214 removed there from, according to one or more embodiments. The photo resist 214 can be removed using an ash blast or solvent. FIG. 2H illustrates a block diagram of a device 200H that includes the device 200G with the adhesion layer 208 dry or wet etched, according to one or more embodiments. The etch can include a selective etching process that targets the adhesion layer 208 and does not target the conductive material 212 or the seed layer 210.

Figure 2I:
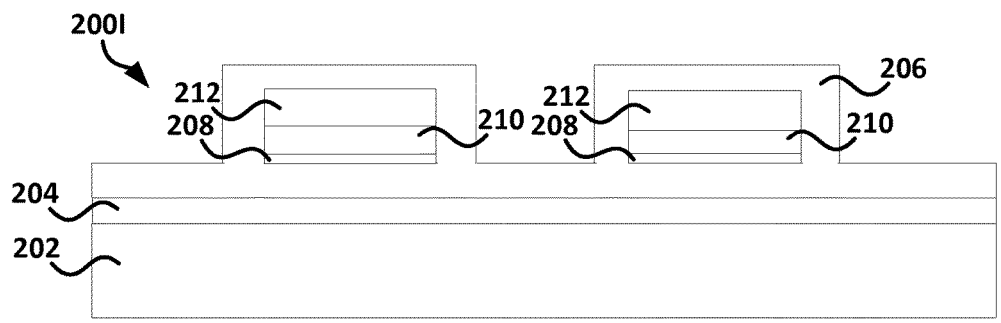

FIG. 2I illustrates a block diagram of a device 200I that includes the device 200H with another PI 206 spun thereon, according to one or more embodiments. The PI 206 can be spun on to cover (e.g., selectively cover) the conductive material 212. The PI 206 can be arranged to cover meandering traces (e.g., traces including the adhesion layer 208, the seed layer 210, and the conductive material 212 after etching). The PI 206 can be non-selectively spun on the device 200H so as to cover a large portion of the device 200H without regard to the location of a trace.

Figure 2J:
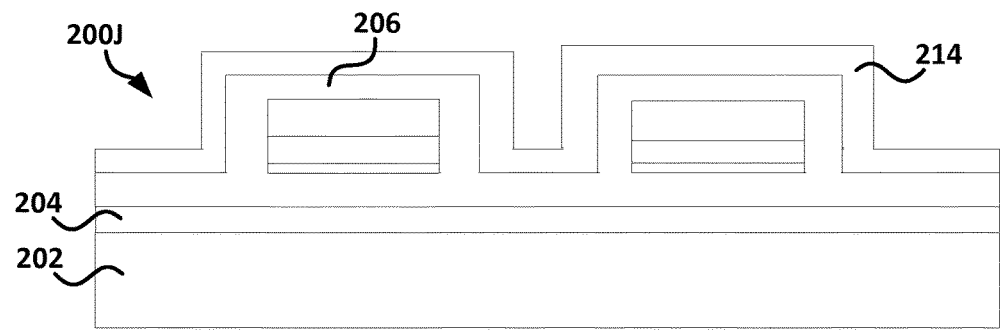
Figure 2K:
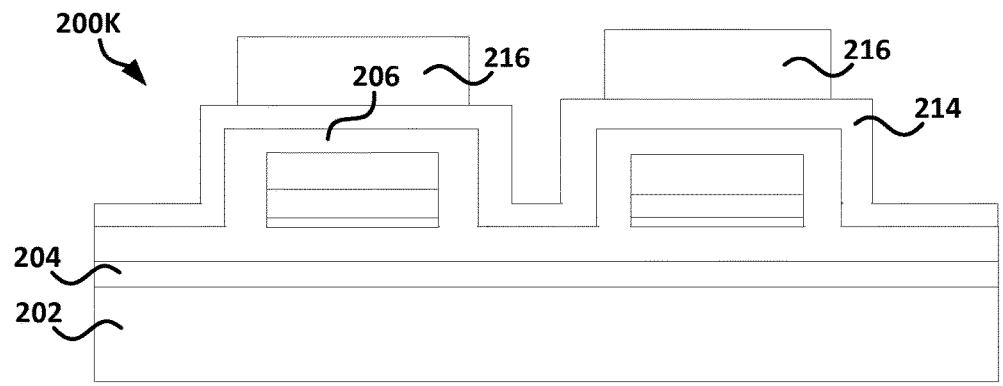

FIG. 2J illustrates a block diagram of a device 200J that includes the device 200I with a hard mask 214 situated thereon, according to one or more embodiments. The hard mask 214 can be resistant to PI etching processes or materials. FIG. 2K illustrates a block diagram of a device 200K that includes the device 200J with photo resist 216 selectively patterned on traces thereon, according to one or more embodiments. The photo resist 216 can be patterned so as to protect the hard mask 214 that is on PI 206 and the hard mask 214 that is on a trace of the device 200K from a hard mask etching process.

Figure 2L:
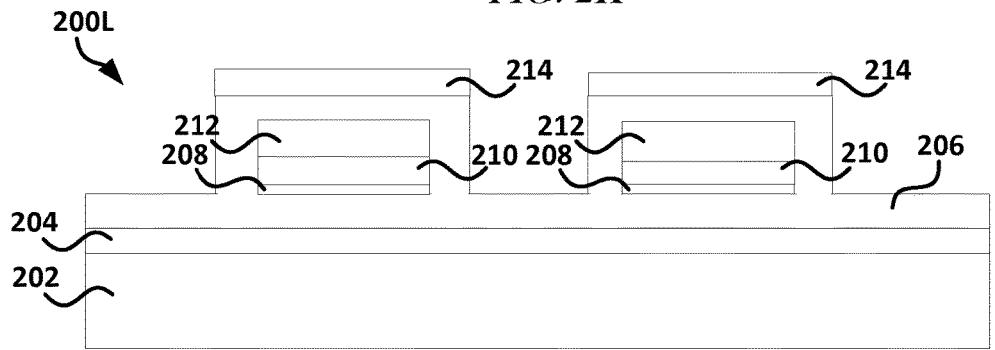
Figure 2M:
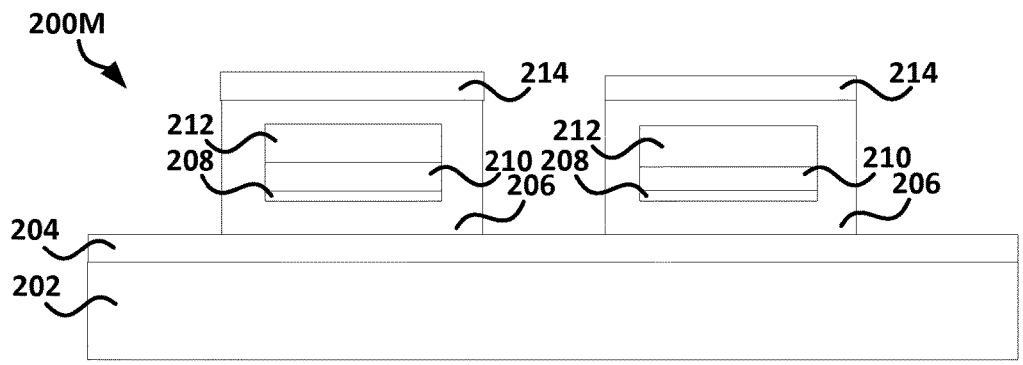

FIG. 2L illustrates a block diagram of a device 200L that includes the device 200K after a hard mask etch and photo resist strip process have been performed, according to one or more embodiments. The hard mask etch process can remove the hard mask 214 that is not protected by the photo resist 216. The photo resist strip process can remove the photo resist 216 from the device 200L. FIG. 2M illustrates a block diagram of a device 200M that includes the device 200L after a PI etch process has been performed, according to one or more embodiments. The PI etch process can remove the PI 206 that is not protected by the hard mask 214. By etching the PI 206, the bendability or the stretchability of the device can be improved. This is due in part to the elastic modulus of PI being greater than that of an elastomer material.

Figure 2N:
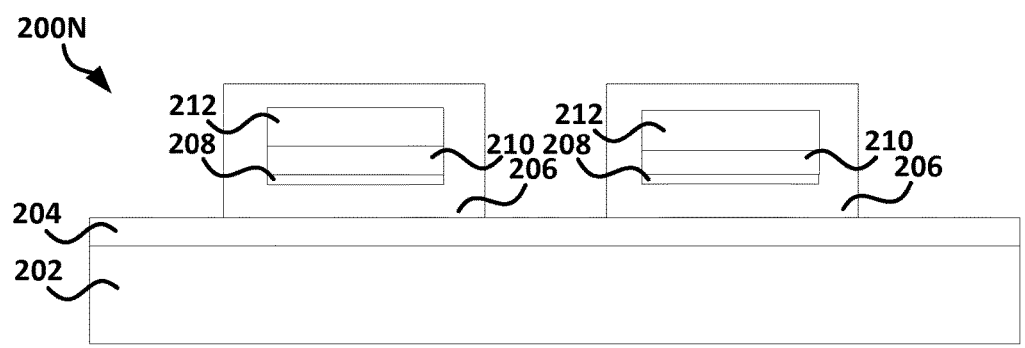
Figure 2O:
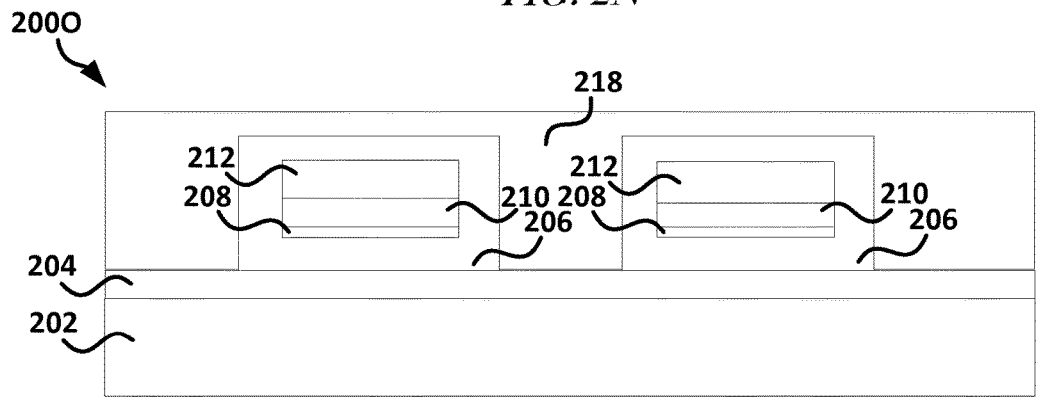

FIG. 2N illustrates a block diagram of a device 200N that includes the device 200M with the hard mask 214 removed there from, according to one or more embodiments. The hard mask 214 can be removed using a selective dry or wet etch process. FIG. 2O illustrates a block diagram of a device 200O that includes the device 200N with an elastomer material 218 thereon, according to one or more embodiments. The elastomer material 218 can provide a bendable and stretchable medium for the trace to be at least partially situated in. The elastomer material 218 can provide some protection to a component of the device 200O from the environment external to the outside environment.

Figure 2P:
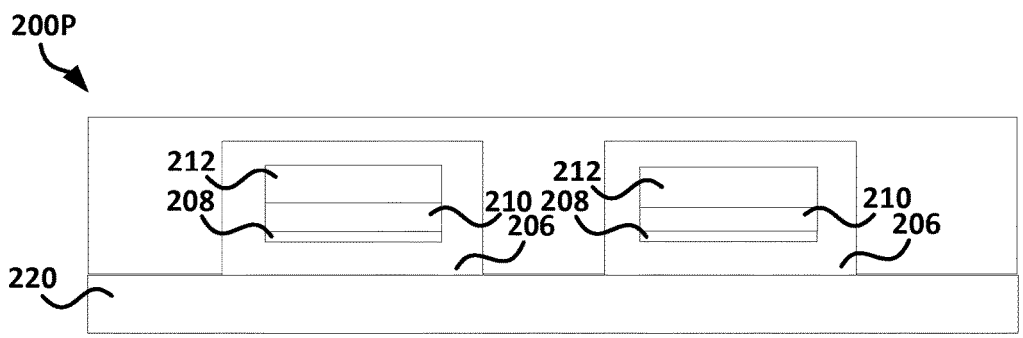

FIG. 2P illustrates a block diagram of a device 200P that include the device 200O with the substrate 202 and the release layer 204 removed there from and another elastomer material 220 situated thereon, according to one or more embodiments. The elastomer material 220 can be the same or a different elastomer material from the elastomer material 218. The elastomer material 220 and the elastomer material 218 can encapsulate (e.g., fully encapsulate) a trace of the device.

This disclosure presents process flows for the fabrication and release of metal lines in a flexible (e.g., bendable and stretchable device). The thick conductive material can be advantageous for the lower line resistances and fewer processing steps. The thin conductive material can include mechanical support of PI, such as to help prevent the conductive material from cracking or breaking. In one or more embodiments, the PI surrounds (e.g., at least partially) only the traces, thus allowing the device to remain flexible.

Figure 3A:
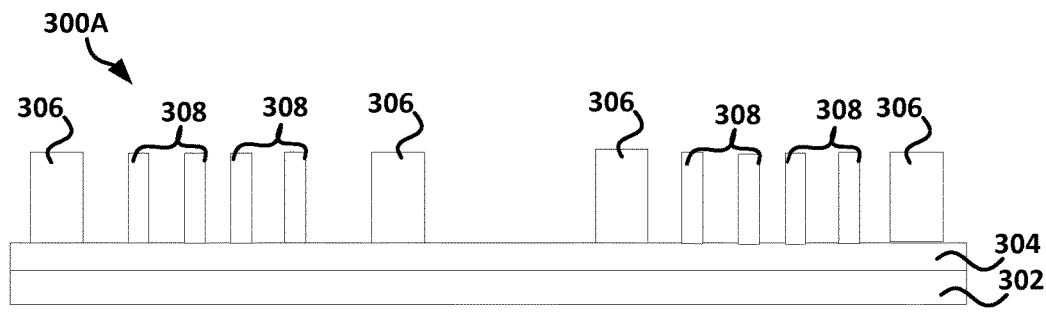
FIGS. 3A, 3B, 3C, and 3D illustrate block diagrams of a process for wire bonding a component, according to one or more embodiments.

FIGS. 3A, 3B, 3C, and 3D illustrate block diagrams of a process for wire bonding a component to the device, according to one or more embodiments. FIG. 3A illustrates a block diagram of a device 300A that includes a substrate 302, a release layer 304, one or more wire bond attach pads 306, or one or more traces 308, according to one or more embodiments. The traces 308 can be thick or thin traces, such as can be produced using the processes described with regard to FIGS. 1A-1L or FIGS. 2A-2P, respectively. The traces 308 can be encapsulated by PI on one side, two sides, fully encapsulated, or not encapsulated by PI at all, such as shown, for example, in FIG. 9A, 9B, 9C, or 9D.

Figure 3B:
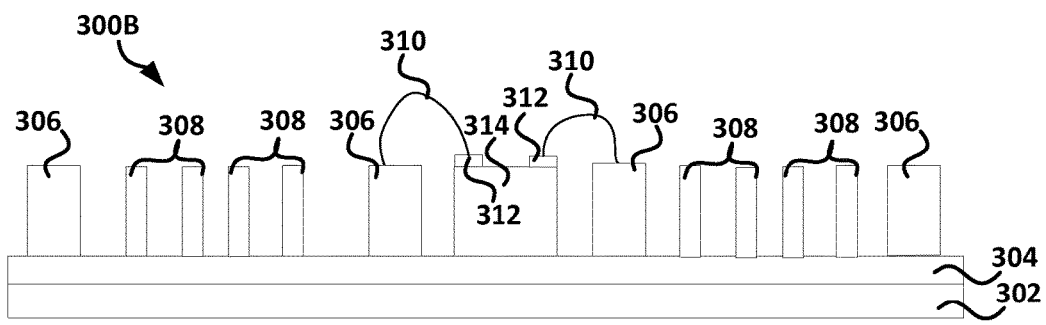

FIG. 3B illustrates a block diagram of the device 300A with a component 314 that is wire bonded to one or more of the bond attach pads 306 through the wire 310, according to one or more embodiments. The component 314 can include one or more bond pads 312 situated thereon. The wire 310 can be soldered or otherwise electrically and mechanically bonded to the bond attach pad 306 and the bond pad 312. The component 314 can include a passive electrical component, such as a resistor, inductor, capacitor, transformer, magnetic device, transducer, sensor, antenna, or detector, among others, active electrical component, such as a transistor, oscillator, diode, Integrated Circuit (IC) (e.g., a die), optoelectronic device, or power source, among others. The component can include an electromechanical component, such as a terminal, connector, cable assembly, piezoelectric device, crystal, resonator, switch, heat sink, or fan, among others.

Figure 3C:
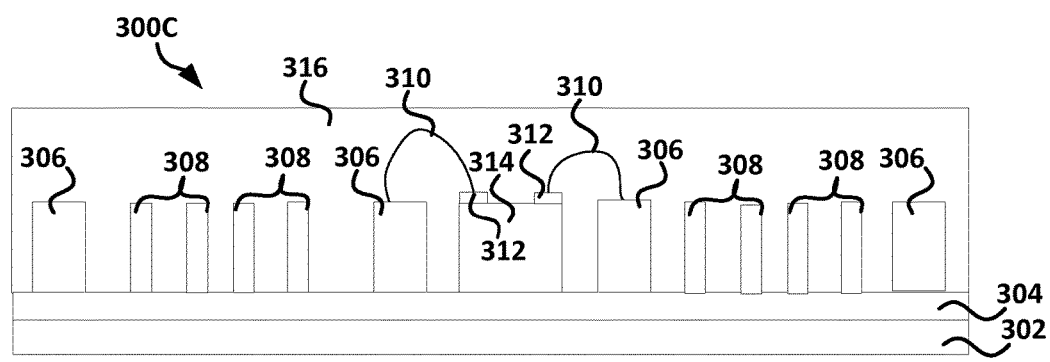
Figure 3D:
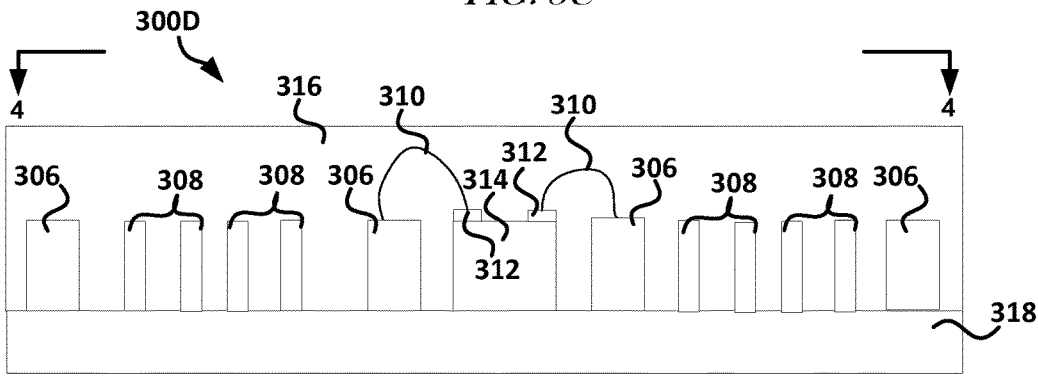

FIG. 3C illustrates a block diagram of a device 300C that includes the device 300B with an elastomer material 316 deposited thereon, according to one or more embodiments. The elastomer material 316 can be situated on or around items of the device 300C. FIG. 3D illustrates a block diagram of a device 300D that includes the device 300C with the substrate 302 and release layer 304 removed there from and an elastomer material 318 situated thereon, according to one or more embodiments. The elastomer material 316 can be the same or a different material from the elastomer material 318. The wire bonded wire can stretch and bend with the elastomer material to have essentially no net change on the elastic modulus of the device.

FIG. 4 shows a planar view block diagram of the device 300D in the direction of arrows labeled "4" in FIG. 3D, according to one or more embodiments.

Figure 5A:
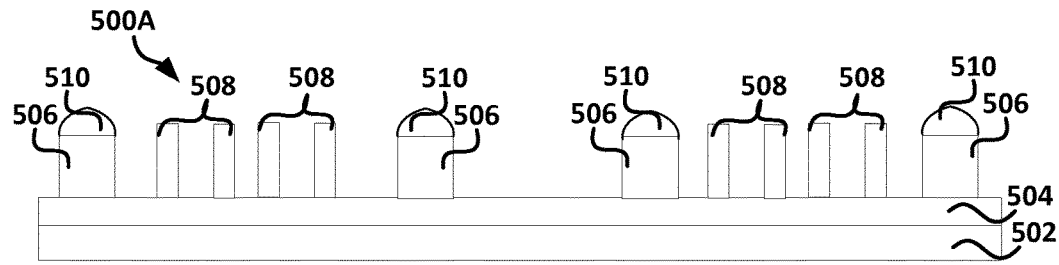
FIGS. 5A, 5B, 5C, and 5D illustrate a process for attaching or mounting a flip chip component, according to one or more embodiments.

FIGS. 5A, 5B, 5C, and 5D illustrate block diagrams of a process for solder bonding a flip chip component to a device, according to one or more embodiments. FIG. 5A illustrates a block diagram of a device 500A that includes a substrate 502, a release layer 504, one or more flip chip attach pads 506, or one or more traces 508, according to one or more embodiments. The traces 508 can be thick or thin traces, such as can be produced using the processes described with regard to FIGS. 1A-1L or FIGS. 2A-2P, respectively. A solder ball 510 can be situated on the attach pad 506 to allow a component to be soldered to the attach pad 506. The traces 508 can be encapsulated by PI on one side, two sides, fully encapsulated, or not encapsulated by PI at all, such as shown, for example, in FIGS. 9A, 9B, 9C, and 9D.

Figure 5B:
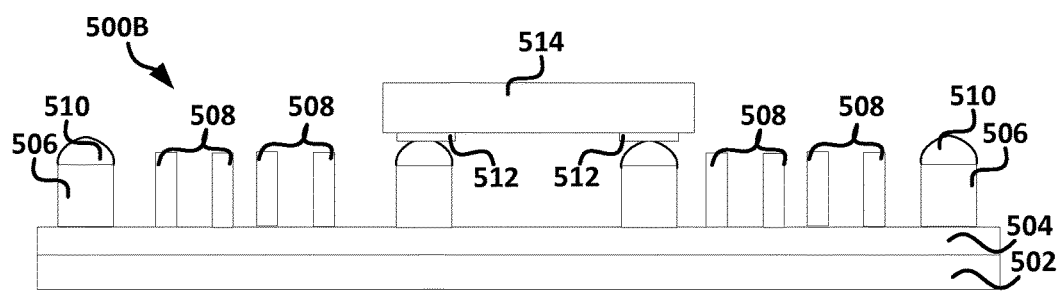

FIG. 5B illustrates a block diagram of the device 500A with a component 514 that is soldered to one or more of the attach pads 506 through the solder ball 510, according to one or more embodiments. The component 514 can include one or more bond pads 512 situated thereon. The component 514 can be similar to the component 314. The component 514 (or 314) can be thin (e.g., less than 100 microns thick) so as to be bendable or can be sized or shaped so as to not significantly effect the overall flexibility of the device 500A. As the thickness of a die decreases, then an achievable bending radius prior to cracking is reduced. The die can include silicon or other semiconductor. The die can include a dielectric and interconnect stack on top. A backside of the die can be coated with a metal (e.g. copper), such as to enhance structural integrity of the die while bending.

Figure 5C:
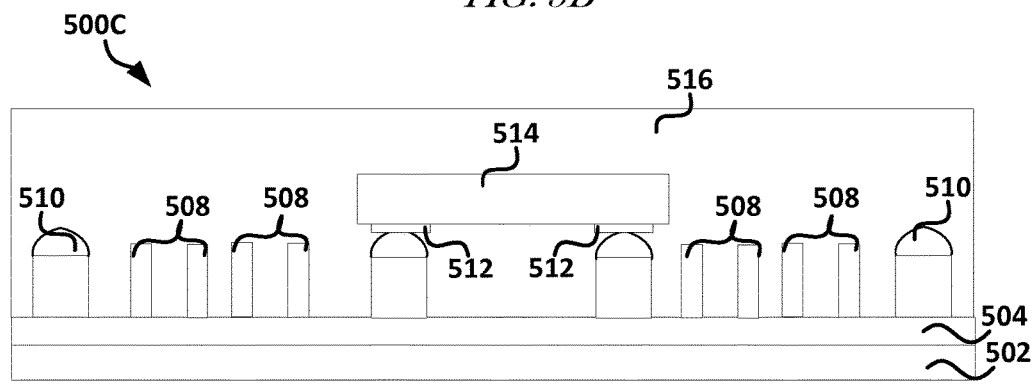
Figure 5D:
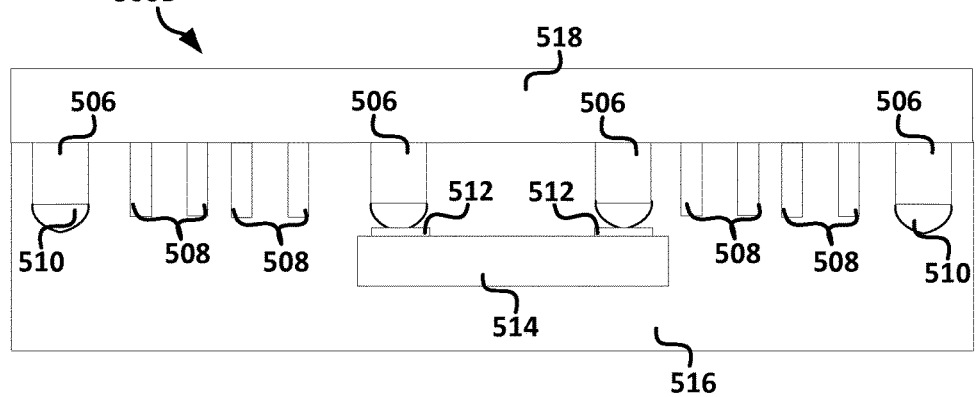

FIG. 5C illustrates a block diagram of a device 500C that includes the device 500B with an elastomer material 516 deposited thereon, according to one or more embodiments. The elastomer material 516 can be situated on or around items of the device 500C. FIG. 5D illustrates a block diagram of a device 500D that includes the device 500C with the substrate 502 and release layer 504 removed there from and an elastomer material 518 situated thereon, according to one or more embodiments. The elastomer material 516 can be the same or a different material from the elastomer material 518.

Figure 6:
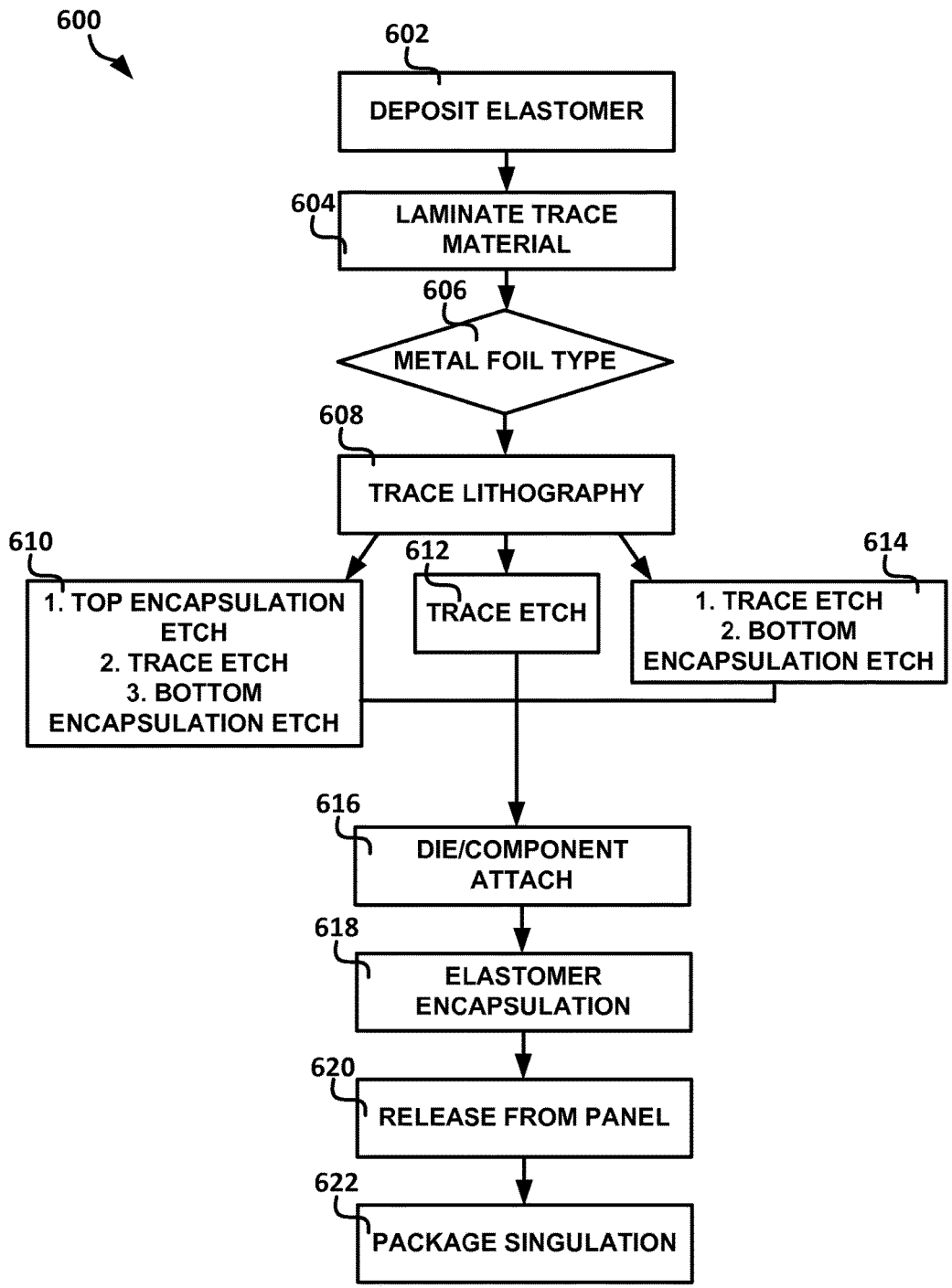
FIG. 6 illustrates a flow diagram of a panel-level process for making a stretchable and bendable device, according to one or more embodiments.

FIG. 6 illustrates a flow diagram for panel-level processes, according to one or more embodiments. The process 600 as illustrated includes: depositing elastomer at operation 602; laminating trace material at operation 604; determining a metal foil type at operation 606; performing trace lithography at operation 608; depending on the type of metal foil, a top encapsulation can be performed at operation 610, a trace etch can be performed at operations 610, 612, or 614, or a bottom encapsulation etch can be performed at operation 610 or 614; a component can be attached at operation 616; elastomer can be deposited at operation 618; a wafer can be released from a panel at operation 620; and a package can be singulated and finished at operation 622.

Figure 9A:
FIGS. 9A, 9B, 9C, and 9D illustrate block diagrams of conductive traces with different respective encapsulation, according to one or more embodiments.
Figure 9B:
Figure 9C:
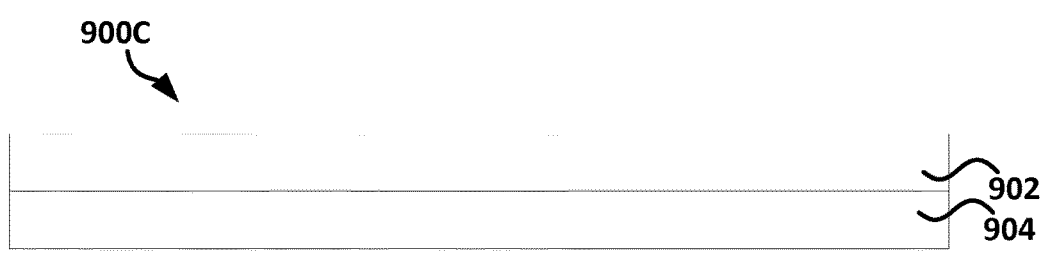
Figure 9D:
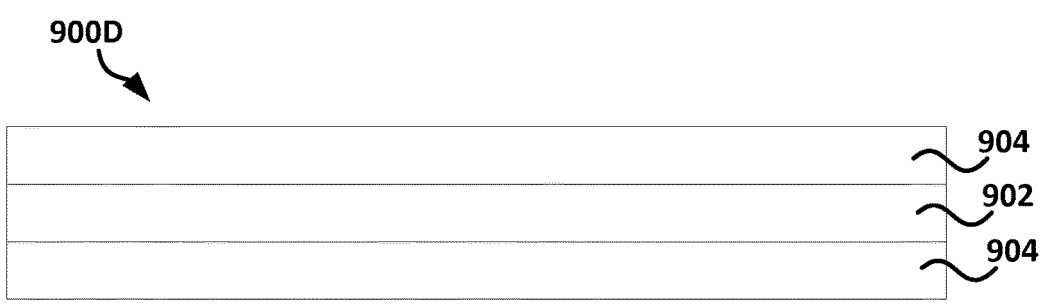

At operation 602, the elastomer can be deposited on a substrate or on a release layer on the substrate. Trace material can be laminated on the elastomer material at operation 604. A metal foil type, such as whether the trace will include PI above, below, surrounding, or no PI around the trace, can be determined at 606. The operation at 606 can include determining whether to use a thick or a thin trace. In an embodiment that includes a trace as shown in FIG. 9A, a trace etch can be performed to pattern the trace material. In an embodiment that includes a trace as shown in FIG. 9B or 9D a PI can be deposited and etched prior to trace lamination. In an embodiment that includes a trace as shown in FIG. 9C or 9D a PI can be deposited over a trace and selectively etched.

Figure 8A:
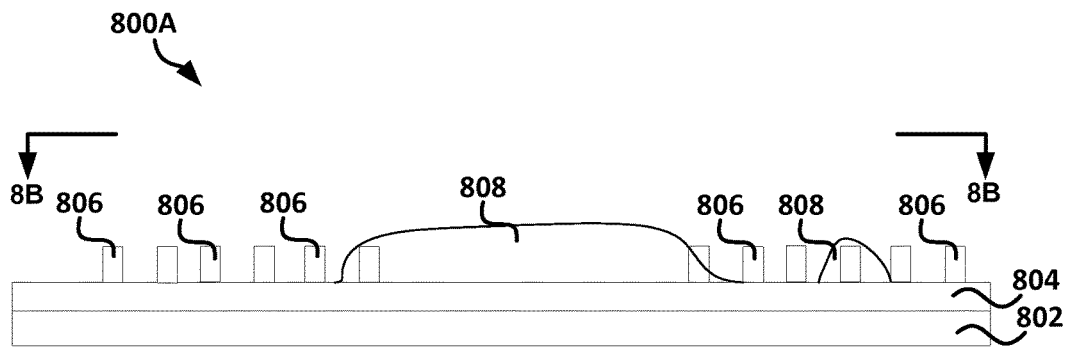
FIGS. 8A, 8B, and 8C illustrate block diagrams of a process for ACF or ACP bonding a component to a device, according to one or more embodiments.
Figure 8B:
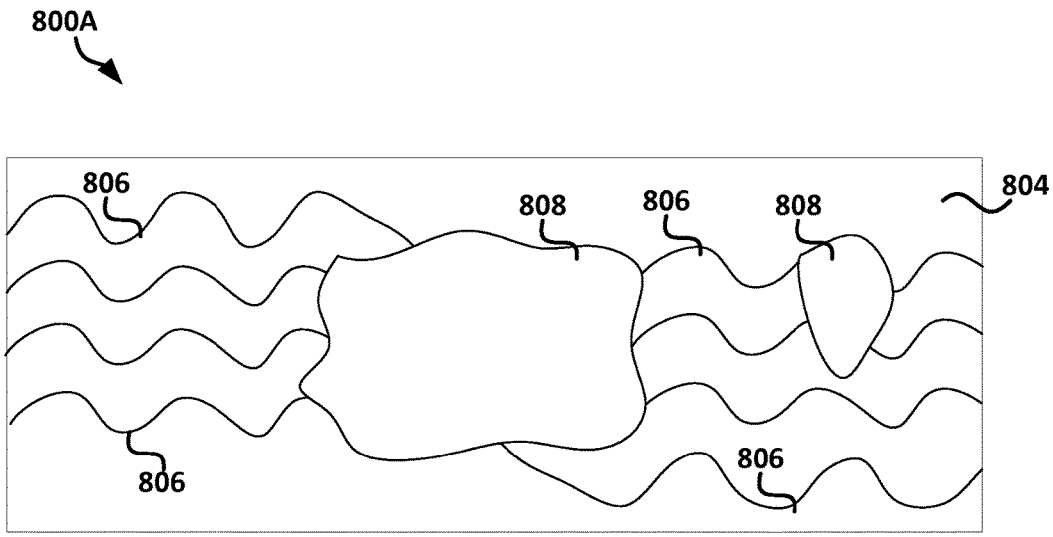
Figure 8C:
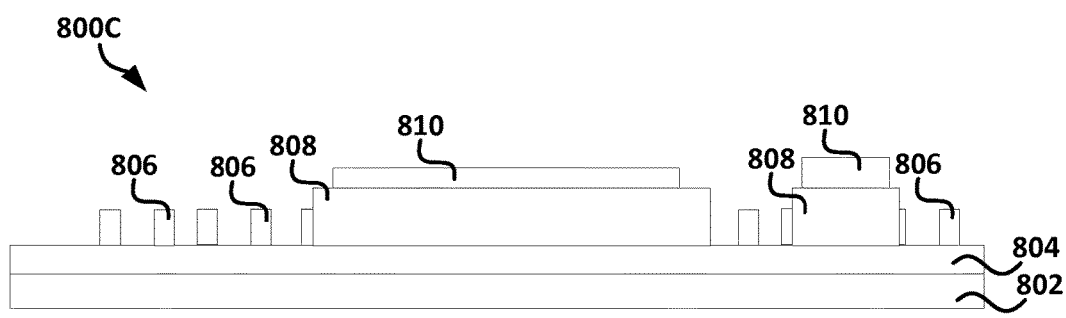

The component attach at operation 616 can include wire bonding, such as shown in FIGS. 3A-3D, a flip chip attach, such as shown in FIGS. 5A-5D, or an AFC or ACP attach, such as shown in FIGS. 8A-8C. At operation 618, another layer of elastomer can be deposited, such as over or around the component or trace of the panel. The operation at 620 can include peeling the elastomer off of the carrier panel. The operation at 620 can include chemically or optically debonding the elastomer from the panel. Package singulation at operation 622 can include laser or saw cutting the package from the panel.

Figure 7:
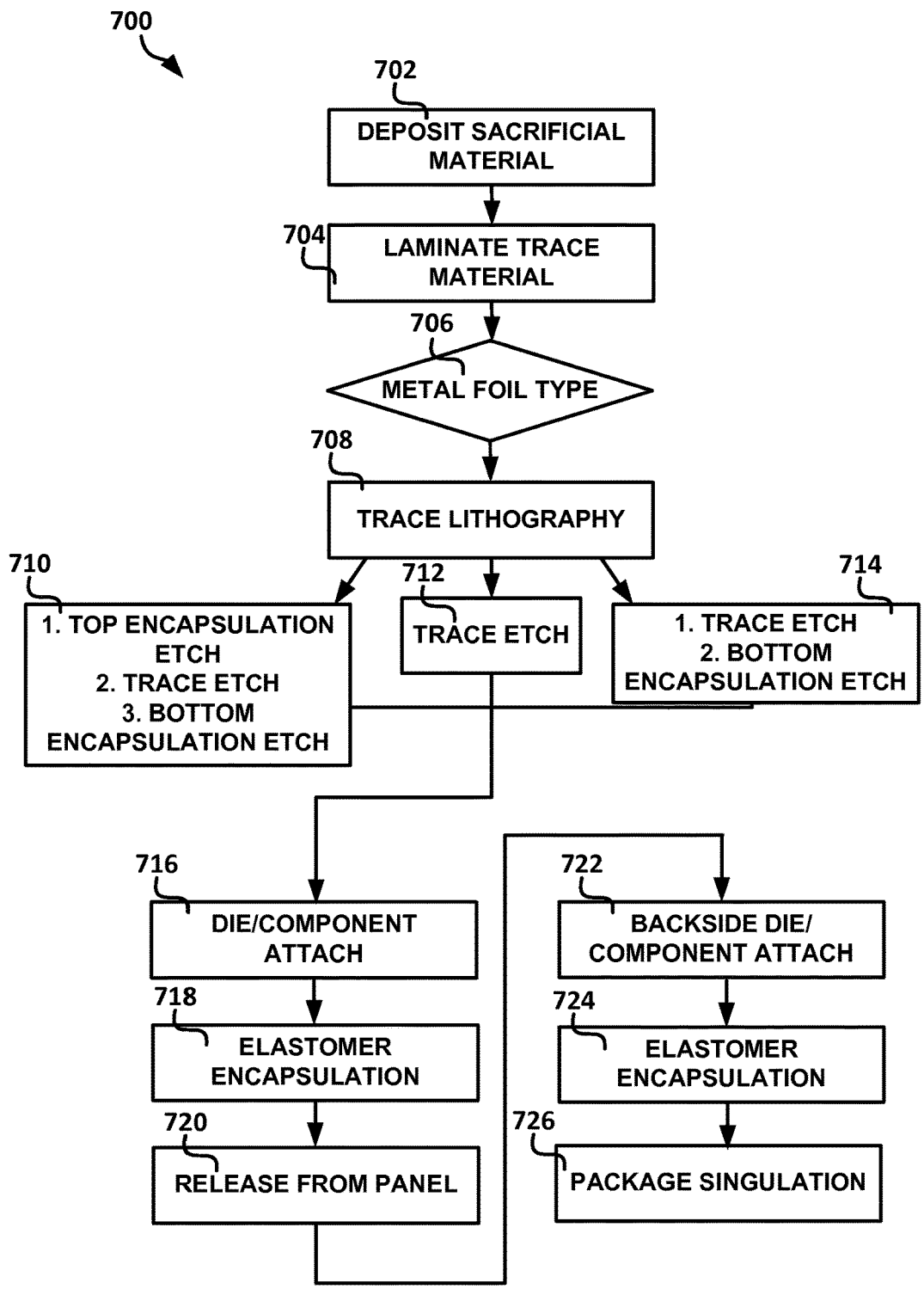
FIG. 7 illustrates a flow diagram of another panel-level process for making a stretchable and bendable device, according to one or more embodiments.

FIG. 7 illustrates a flow diagram for a panel-level device manufacturing process, according to one or more embodiments. The process 700 as illustrated includes: depositing sacrificial material at operation 702; laminating trace material at operation 704; determining a metal foil type at operation 706; performing trace lithography at operation 708; depending on the determined metal foil type at operation 706, a top encapsulation can be performed at operation 710, a trace etch can be performed at operations 710, 712, or 714, or a bottom encapsulation etch can be performed at operation 710 or 714; a component can be attached at operation 716; elastomer can be deposited at operation 718; a wafer can be released from a panel at operation 720; a component can be attached to a backside of a device at operation 722; another elastomer can be deposited at operation 724; and a package can be singulated and finished at operation 726.

At operation 702, the sacrificial material can be situated on a release layer on a carrier panel. At operation 704, the trace material can be laminated on the sacrificial material. A metal foil type, such as whether the trace will include PI above, below, surrounding, or no PI around the trace, can be determined at operation 706. The operation at 706 can include determining whether to use a thick or a thin trace. In an embodiment that includes a trace as shown in FIG. 9A, a trace etch can be performed to pattern the trace material.

In an embodiment that includes a trace as shown in FIG. 9B or 9D a PI can be deposited and etched prior to trace lamination. In an embodiment that includes a trace as shown in FIG. 9C or 9D a PI can be deposited over a trace and selectively etched.

The component attach at operation 716 can include wire bonding, such as shown in FIGS. 3A-3D, a flip chip attach, such as shown in FIGS. 5A-5D, or an AFC or ACP attach, such as shown in FIGS. 8A-8C. At operation 718, a layer of elastomer can be deposited, such as over or around the component or trace of the panel. The process 700 can include removing the sacrificial material after releasing the wafer from the panel.

The operation at 720 can include using the sacrificial material as a debond material or placing the sacrificial material on a debond material. The debond material can be allow for good adhesion between the panel and the elastomer. However, at a certain temperature (in the case of a thermal debond) or optical irradiation (e.g., Ultra Violet light in an optical debond) the debond material can have its adhesive properties reduced and the elastomer or sacrificial material on the debond material can be removed from the panel. If an optical debond is used the panel can be transparent for the debond light to pass there through (e.g., the panel can include glass or a transparent polymer, among other materials).

The operation at 722 can include attaching a component on a side of the device that was connected to the sacrificial material. The side of the device can be opposite a side that the component was attached on at operation 716. The operation at 724 can include depositing an elastomer that is the same or different from the elastomer deposited at operation 718. Package singulation at operation 726 can include laser or saw cutting the package from the panel.

FIG. 8A illustrates a block diagram of a device 800A that can include a substrate carrier 802 (e.g., a panel or wafer carrier) a release layer 804, one or more electrical interconnects 806, and a conductive adhesive material 808 situated thereon, according to one or more embodiments. The conductive adhesive material 808 can include an ACF or an ACP, or other liquid conductive material. FIG. 8B shows the device 800A from a point of view as indicated by the arrows labeled "8B" in FIG. 8A. FIG. 8C shows the device 800A after a component 810 has been attached to the conductive adhesive material 808. The component 810 can be situated on the conductive adhesive material 808 and the conductive adhesive material 808 can be cured so as to solidify the material and attached the component 810 thereto.

FIGS. 9A, 9B, 9C, and 9D illustrate planar cross-section views of a portion of a trace, such as shown in FIG. 3A-3D, 4, 5A-5D, or 8A-8C, according to one or more embodiments. FIG. 9A illustrates a block diagram of a trace 900A that includes no encapsulation. The trace 900A can include conductive material 902. FIG. 9B illustrates a block diagram of a trace 900B with an encapsulant 904 on the top side of the conductive material 902. FIG. 9C illustrates a block diagram of a trace 900C with an encapsulant 904 on the bottom side of the conductive material 902. FIG. 9D illustrates a block diagram of a trace 900D with an encapsulant 904 on the top and bottom sides of the conductive material 902. A trace can include encapsulant surrounding the entire trace or only portions of the trace. By reducing the amount of encapsulant used, the elastic modulus of a device that includes the trace can be increased. The encapsulant can include PI, PolyEthylene Terephthalate (PET), PolyEthylene Naphtalate (PEN), or PolyOlephine (PO), among others.

As used herein, the term "deposition" or "lamination" used for a dielectric layer or photo resist can mean a variety of methods. Atypical panel-level process can include a dry-film lamination. Alternatively, a slit coating, jet-printing (jetting) or other method can be used. As used herein the term "deposition" or "lamination" for a metal can include a variety of methods. The processes can include metal foil lamination, sputtering, or Chemical Vapor Deposition (CVD). A metal can be plated such as by using a plated metal from a third party or applying a plating process to the metal.

As used herein, the term "metal foil" can include a bare metal sheet, a metal coated with adhesive on at least one side thereof, or a composite material comprising of a sheet of metal and a dielectric material on at least one side of the metal. As used herein, the term "etch" refers to an etching method for creating package traces. A wet chemical or dry etch process can be used.

As used herein the term "component attach" refers to attaching passive or active components to the package traces. Example component attach methods include soldering with a lead-free solder (e.g., SnIn, SnBi, SAC305, SnAg, SAC405, SnCu); attachment using Anisotropic Conductive Film (ACF), Anisotropic Conductive Paste (ACP), or conductive organic materials allowing for adhesion and electrical connectivity; or wire bonding. Each component attach process can include added processing to allow for the component attach.

As used herein the term "die mount/attach" refers to the attachment of silicon or other semiconductor dies, such as a memory, Multi-Chip Unit (MCU), Central Processing Unit (CPU), or wireless device (radio), among others. The attachment methods can include attachment by ACF (if resistance of ACF joints allows for its use), soldering using solder materials as described for the "component attach" process, or Wire-bonding.

If a passive or active component does not have solder, the package manufacturing process can include a solder bumping sub-flow to form a package with solder bumps, such as shown in FIG. 5A. A known package solder bumping flow may be used. If the passive or active component includes solder, solder-bumping may not be needed. The passive or active component can be soldered to the package. Soldering by C4-reflow or Thermo-Compression-Bonding (TCB) can be used, such as shown in FIG. 5B.

Depending on the material used in a trace, it can be beneficial to cover a wire bonding region of the trace (e.g., a wire bond pad coupled to the trace) with a metal different than the trace metal. A process can be used to create a surface finish on the wire bond pad so as to allow for a reliable wire bond to be created. Such a process can include wire bond pad definition lithography and metal deposition that can be (but not limited to) sputtering or plating. The photo resist from the lithography can be removed, such as shown in FIG. 3A. The passive or active component can be wire-bonded to the package, such as shown in FIG. 3B.

Using an ACF process, a passive or active component or on attach area on a package can be laminated. Using an ACP process, liquid paste can jetted where required, such as shown in FIG. 8A and FIG. 8B. The passive or active component can be pressed onto the ACP areas and the areas can be cured so as to secure the component in place, such as shown in FIG. 8C.

Combinations of different attach methods can be used in a panel or wafer level manufacturing process.

The term "elastomer" refers to materials such as PDMS, butyl rubber, Viton®, LET7, polyurethane, high elongation PI or high elongation Polyethylene Terephthalate (PET). The sacrificial material can include a material such as PI, PET, or revalpha, among others, that can be removed from the elastomer. The debond material can be chosen from debond materials available in the industry depending on the debond process to be implemented. Note that materials referred to herein as elastomer can include a bendable dielectric material, such as PI. PI is bendable and generally not stretchable.

Figure 10:
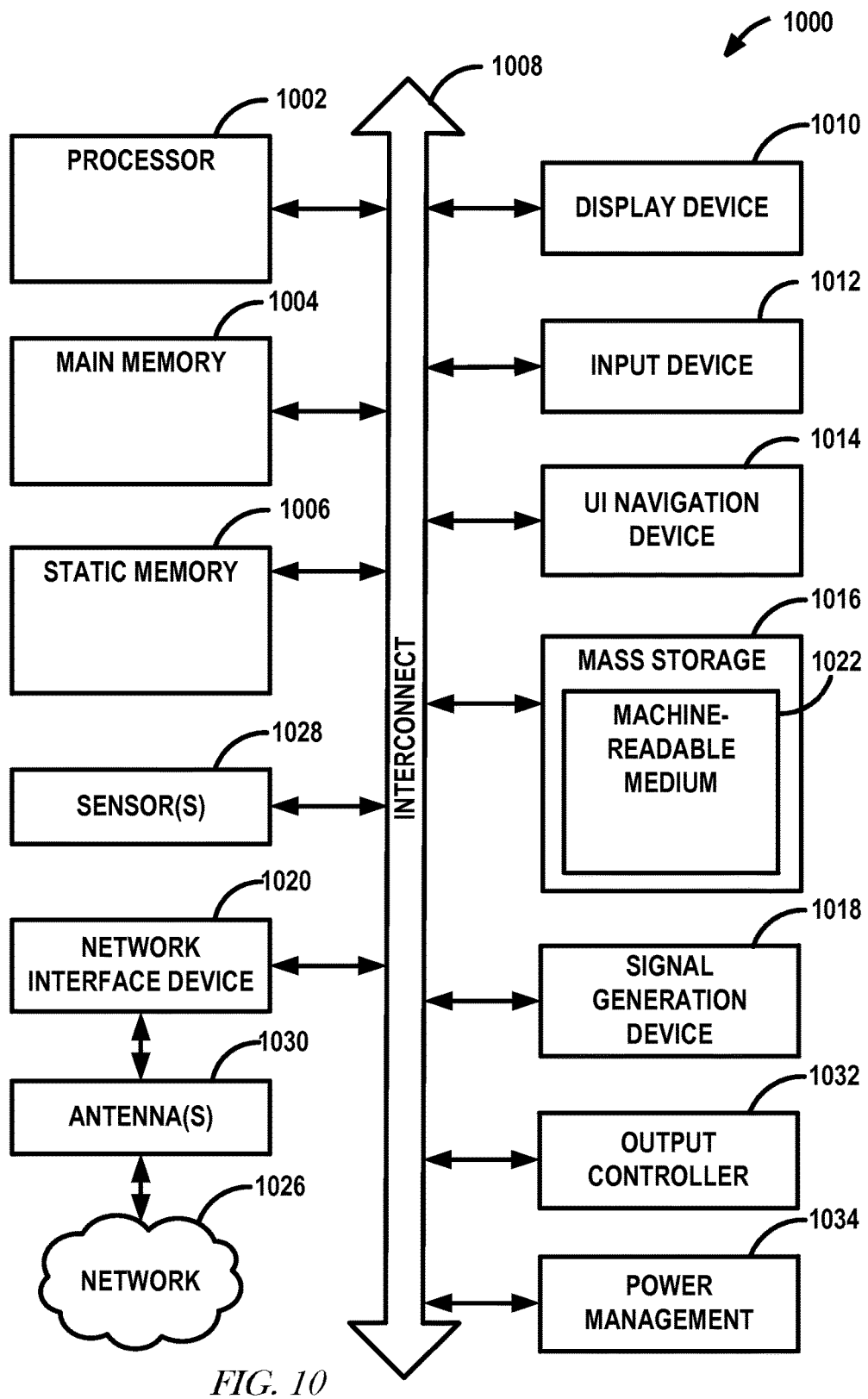
FIG. 10 shows an example of a computer system.

FIG. 10 is a block diagram illustrating an example computer system 1000 machine which can include or be implemented at least partially on a device as discussed herein. Computer system 1000 can be a computing device. In an example, the machine can operate as a standalone device or can be connected (e.g., via a cellular network) to other machines. In a networked deployment, the machine can operate in the capacity of either a server or a client machine in server-client network environments, or it can act as a peer machine in peer-to-peer (or distributed) network environments. Further, while only a single machine is illustrated, the term "machine" shall also be taken to include any collection of machines that individually or jointly execute a set (or multiple sets) of instructions to perform any one or more of the methodologies discussed herein.

Example computer system 1000 can include a processor 1002 (e.g., a Central Processing Unit (CPU), a Graphics Processing Unit (GPU) or both), a main memory 1004 and a static memory 1006, which communicate with each other via an interconnect 1008 (e.g., a link, a bus, etc.). The computer system 1000 can further include a video display unit 1010, an alphanumeric input device 1012 (e.g., a keyboard), and a User Interface (UI) navigation device 1014 (e.g., a mouse). In an example, the video display unit 1010, input device 1012 and UI navigation device 1014 are a touch screen display. The computer system 1000 can additionally include a storage device 1016 (e.g., a drive unit), a signal generation device 1018 (e.g., a speaker), an output controller 1032, a power management controller 1034, and a network interface device 1020 (which can include or operably communicate with one or more antennas 1030, transceivers, or other wireless communications hardware), and one or more sensors 1028, such as a GPS sensor, compass, location sensor, accelerometer, or other sensor. The antennas 1030 can be coupled to a network 1026. Any of the items of the system 1000 can include a substrate that was built on a panel discussed herein.

EXAMPLES AND NOTES

The present subject matter may be described by way of several examples.

Example 1 can include or use subject matter (such as an apparatus, a method, a means for performing acts, or a device readable memory including instructions that, when performed by the device, can cause the device to perform acts), such as can include or use (1) depositing a first elastomer material on a panel, (2) laminating trace material on the elastomer material, (3) processing the trace material to pattern the trace material into one or more traces and one or more bond pads, (4) attaching a die to the one or more bond pads, or (5) depositing a second elastomer material on and around the one or more traces, the bonds pads, and the die to encapsulate the one or more traces and the one or more bond pads in the first and second elastomer materials.

Example 2 can include or use, or can optionally be combined with the subject matter of Example 1 to include or use, wherein processing the trace material includes processing the trace material to form a trace with a thickness of less than about 500 nanometers.

Example 3 can include or use, or can optionally be combined with the subject matter of Example 2 to include or use situating a first trace encapsulation material on the first elastomer material before laminating the trace material on the first elastomer material, or selectively removing portions of the first trace encapsulation material to pattern the first trace encapsulation material.

Example 4 can include or use, or can optionally be combined with the subject matter of Example 3 to include or use situating a second trace encapsulation material on the one or more traces, or selectively removing portions of the second trace encapsulation material.

Example 5 can include or use, or can optionally be combined with the subject matter of at least one of Examples 1-4 to include or use releasing the first elastomer material from the panel, or singulating a bendable and stretchable device after releasing the first elastomer material.

Example 6 can include or use, or can optionally be combined with the subject matter of Example 1 or Example 5 to include or use, wherein processing the trace material includes processing the trace material so as to form a trace with a thickness of between about 500 nanometers and twenty-five micrometers.

Example 7 can include or use, or can optionally be combined with the subject matter of at least one of Examples 1-6 to include or use, wherein attaching a component to the one or more bond pads includes attaching a die that is between about ten and 300 micrometers thick.

Example 8 can include or use, or can optionally be combined with the subject matter of at least one of Examples 1-7 to include or use, wherein attaching a die to the one or more bond pads includes wire bonding the die to the one or more bond pads.

Example 9 can include or use, or can optionally be combined with the subject matter of at least one of Examples 1-7 to include or use, wherein attaching a die to the one or more bond pads includes solder bonding the die to the one or more bond pads.

Example 10 can include or use subject matter (such as an apparatus, a method, a means for performing acts, or a device readable memory including instructions that, when performed by the device, can cause the device to perform acts), such as can include or use (1) depositing a sacrificial material on a panel, (2) laminating trace material on the sacrificial material, (3) processing the trace material to pattern the trace material into one or more traces and one or more bond pads, (4) attaching a first die to the one or more bond pads at a first side of the one or more bond pads, (5) depositing a first elastomer material on and around the one or more traces, the one or more bond pads, and the first die, (6) releasing the sacrificial material, one or more traces, the one or more bond pads, the first die, and the first elastomer material from the panel, (7) removing the sacrificial material, or (8) depositing a second elastomer material on the one or more traces, the one or more bonds pads, and the first elastomer material to encapsulate the one or more traces and the one or more bond pads in the first and second elastomer materials.

Example 11 can include or use, or can optionally be combined with the subject matter of Example 10 to include or use, wherein processing the trace material includes processing the trace material so as to form a trace with a thickness of less than about 500 nanometers.

Example 12 can include or use, or can optionally be combined with the subject matter of Example 11 to include or use situating a first trace encapsulation material on the sacrificial material before laminating the trace material on the sacrificial material, or selectively removing portions of the first trace encapsulation material to pattern the first trace encapsulation material.

Example 13 can include or use, or can optionally be combined with the subject matter of Example 12 to include or use situating a second trace encapsulation material on the one or more traces, or selectively removing portions of the second trace encapsulation material.

Example 14 can include or use, or can optionally be combined with the subject matter of at least one of Examples 10-13 to include or use singulating a bendable and stretchable device after releasing the first elastomer material.

Example 15 can include or use, or can optionally be combined with the subject matter of at least one of Examples 10 and 14 to include or use, wherein processing the trace material includes processing the trace material so as to form a trace with a thickness of between about 500 nanometers and twenty-five micrometers.

Example 16 can include or use, or can optionally be combined with the subject matter of at least one of Examples 10-15 to include or use, wherein attaching the first die to the one or more bond pads includes attaching a die that is between about ten and three hundred micrometers thick.

Example 17 can include or use, or can optionally be combined with the subject matter of at least one of Examples 10-16 to include or use, wherein attaching the first die to the one or more bond pads includes wire bonding the first die to the one or more bond pads.

Example 18 can include or use, or can optionally be combined with the subject matter of at least one of Examples 10-16 to include or use, wherein attaching the first die to the one or more bond pads includes solder bonding the first die to the one or more bond pads.

Example 19 can include or use, or can optionally be combined with the subject matter of at least one of Examples 10-18 to include or use attaching a second die to a bond pad of the one or more bond pads at a second side of the one or more bond pads opposite the first side of the one or more bond pads.

Example 20 can include or use subject matter (such as an apparatus, a method, a means for performing acts, or a device readable memory including instructions that, when performed by the device, can cause the device to perform acts), such as can include or use an elastomer substrate, a plurality of meandering traces encapsulated in the elastomer substrate, a plurality of bond pads encapsulated in the elastomer substrate, wherein bond pads of the plurality of bond pads are electrically coupled through a meandering trace of the plurality of meandering traces, a bendable electronic die with a thickness of between about ten and three hundred microns encapsulated in the elastomer substrate, or electrical bonds coupling the die to the bond pads.

Example 21 can include or use, or can optionally be combined with the subject matter of Example 20 to include or use, wherein the traces are less than 500 nanometers thick and wherein the apparatus further comprises a material with an elastic modulus between an elastic modulus of the elastomer and the elastic modulus of the meandering traces mechanically supporting the traces.

Example 22 can include or use, or can optionally be combined with the subject matter of Example 21 to include or use, wherein the material is situated on two opposite sides of the traces.

Example 23 can include or use, or can optionally be combined with the subject matter of Example 21 to include or use, wherein the material is situated on only one side of the traces.

Example 24 can include or use, or can optionally be combined with the subject matter of Example 21 to include or use, wherein the material surrounds the traces.

Example 25 can include or use, or can optionally be combined with the subject matter of at least one of Examples 20-24 to include or use, wherein the elastomer includes PolyDiMethySiloxane (PDMS) and the traces include copper.

Example 26 can include or use, or can optionally be combined with the subject matter of at least one of Examples 20-25 to include or use, wherein the electrical bonds include wire bonds.

Example 27 can include or use, or can optionally be combined with the subject matter of at least one of Examples 20-25 to include or use, wherein the die is a flip chip die and the electrical bonds include solder bonds.

Example 28 can include or use, or can optionally be combined with the subject matter of at least one of Examples 20-25 to include or use, wherein the wire bonds include an Anisotropic Conductive Paste (ACP) or an Anisotropic Conductive Film (ACF) bond.

Example 29 can include or use, or can optionally be combined with the subject matter of at least one of Examples 21-28 to include or use, wherein the material includes PI.

Example 30 can include or use subject matter (such as an apparatus, a method, a means for performing acts, or a device readable memory including instructions that, when performed by the device, can cause the device to perform acts), such as can include or use (1) depositing a release layer on a substrate, (2) patterning photo resist on the release layer, (3) situating a first conductive material between the patterned photo resist and on the release layer, (4) removing the photo resist, (5) situating a first elastomer on and around the first conductive material, (6) releasing the release layer, or (7) situating a second elastomer on the first conductive material and the first elastomer to encapsulate the first conductive material between the first and second elastomers.

Example 31 can include or use, or can optionally be combined with the subject matter of Example 30 to include or use sputtering a second conductive material on the release layer before patterning the photo resist.

Example 32 can include or use, or can optionally be combined with the subject matter of Example 31 to include or use depositing a third conductive material on the sputtered second conductive material before patterning the photo resist.

Example 33 can include or use, or can optionally be combined with the subject matter of Example 32 to include or use situating an etch stop and adhesion layer on the third conductive material before patterning the photo resist.

Example 34 can include or use, or can optionally be combined with the subject matter of Example 33 to include or use removing portions of the second conductive material, third conductive material, and adhesion layer before situating the first elastomer on and around the first conductive material, and wherein situating the first elastomer on and around the first conductive material includes situating the first elastomer on and around unremoved portions of the first, second, and third conductive materials.

Example 35 can include or use, or can optionally be combined with the subject matter of Example 34 to include or use, wherein patterning the photo resist includes patterning the photo resist so as to provide first, second, and third conductive materials shaped in a meandering trace pattern.

Example 36 can include or use subject matter (such as an apparatus, a method, a means for performing acts, or a device readable memory including instructions that, when performed by the device, can cause the device to perform acts), such as can include or use (1) depositing a release layer on a substrate, (2) situating a first material with an elastic modulus between an elastic modulus of a first conductive material and an elastomer on the release layer, (3) depositing a first conductive material on the first material, (4) patterning an etch resistant material on the first conductive material, (5) removing portions of the first conductive material not protected by the etch resistant material, (6) removing the etch resistant material, (7) removing portions of the first material in locations between the first conductive material, (8) situating a first elastomer on and around the first material, (9) releasing the release layer, or (10) situating a second elastomer on the first material and the first elastomer to encapsulate the first conductive material and the first material between the first and second elastomers.

Example 37 can include or use, or can optionally be combined with the subject matter of Example 36 to include or use situating a second material with an elastic modulus between the elastic modulus of the first conductive material and the first elastomer on the first material and the first conductive material before removing portions of the first material.

Example 38 can include or use, or can optionally be combined with the subject matter of Example 37 to include or use, wherein removing portions of the first material includes situating a mask material on portions of the second material, removing portions of the first and second materials in locations not protected by the mask, and removing the mask.

Example 39 can include or use, or can optionally be combined with the subject matter of at least one of Examples 36-39 to include or use depositing a second conductive material on the first material before depositing the first conductive material on the first material.

The above detailed description includes references to the accompanying drawings, which form a part of the detailed description. The drawings show, by way of illustration, specific embodiments in which methods, apparatuses, and systems discussed herein can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

As used herein, a "-" (dash) used when referring to a reference number means "or", in the non-exclusive sense discussed in the previous paragraph, of all elements within the range indicated by the dash. For example, 103A-B means a nonexclusive "or" of the elements in the range {103A, 103B}, such that 103A-103B includes "103A but not 103B", "103B but not 103A", and "103A and 103B".

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
   an elastomer substrate;
   a plurality of meandering traces encapsulated in the elastomer substrate;
   a plurality of bond pads encapsulated in the elastomer substrate, wherein bond pads of the plurality of bond pads are electrically coupled through a meandering trace of the plurality of meandering traces;
   a material, different from the elastomer substrate, with an elastic modulus between an elastic modulus of the elastomer substrate and the elastic modulus of the meandering traces, between the meandering traces and the elastomer substrate, in direct physical contact with the meandering traces on vertical sides and top and bottom sides of the meandering traces, in direct physical contact with the elastomer substrate, forming an interface between the meandering traces and the elastomer substrate, and encapsulated by the elastomer substrate;
   a bendable electronic die with a thickness of between about ten and three hundred microns encapsulated in the elastomer substrate; and
   electrical bonds coupling the die to the bond pads.

2. The apparatus of claim 1, wherein the traces are less than 500 nanometers thick.

3. The apparatus of claim 1, wherein the elastomer includes PolyDiMethySiloxane (PDMS) and the traces include copper.

4. The apparatus of claim 3, wherein the material includes polyimide.

5. The apparatus of claim 3, wherein the material includes at least one of polyethylterephthalate, polyethelene naphtalate, and polyolephine.

* * * * *

UNITED STATES PATENT AND TRADEMARK OFFICE
CERTIFICATE OF CORRECTION

PATENT NO. : 10,204,855 B2  
APPLICATION NO. : 14/653033  
DATED : February 12, 2019  
INVENTOR(S) : Levander et al.

Page 1 of 1

It is certified that error appears in the above-identified patent and that said Letters Patent is hereby corrected as shown below:

On the Title Page

Item [56], Line 2, delete "Apr. 20, 2015"," and insert --Apr. 30, 2015",-- therefor Signed and Sealed this  
Twenty-third Day of June, 2020

Andrei Iancu  
*Director of the United States Patent and Trademark Office*